(12) United States Patent
Yamabe et al.

(10) Patent No.: US 9,508,554 B2
(45) Date of Patent: Nov. 29, 2016

(54) METHOD OF MANUFACTURING SEMICONDUCTOR DEVICE

(71) Applicant: Renesas Electronics Corporation, Koutou-ku, Tokyo (JP)

(72) Inventors: Kazuharu Yamabe, Ibaraki (JP); Shinichiro Abe, Tokyo (JP); Shoji Yoshida, Ibaraki (JP); Hideaki Yamakoshi, Tokyo (JP); Toshio Kudo, Ibaraki (JP); Seiji Muranaka, Tokyo (JP); Fukuo Owada, Tokyo (JP); Daisuke Okada, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/869,988

(22) Filed: Sep. 29, 2015

(65) Prior Publication Data
US 2016/0093499 A1    Mar. 31, 2016

(30) Foreign Application Priority Data
Sep. 30, 2014    (JP) ................................. 2014-201387

(51) Int. Cl.
| H01L 21/4763 | (2006.01) |
| H01L 21/28 | (2006.01) |
| H01L 29/66 | (2006.01) |
| H01L 29/792 | (2006.01) |

(52) U.S. Cl.
CPC ... *H01L 21/28282* (2013.01); *H01L 21/28194* (2013.01); *H01L 29/66833* (2013.01); *H01L 29/792* (2013.01)

(58) Field of Classification Search
CPC .................. H01L 21/28282; H01L 21/28194; H01L 29/513; H01L 29/518; H01L 29/66833
USPC ......................................................... 438/591
See application file for complete search history.

(56) References Cited

U.S. PATENT DOCUMENTS

2006/0003596 A1 * 1/2006 Fucsko ................. H01L 21/316
                                                                 438/758
2006/0084242 A1    4/2006 Wang
(Continued)

FOREIGN PATENT DOCUMENTS

| JP | 55-087490 A | 7/1980 |
| JP | 5-160095 A | 6/1993 |

(Continued)

OTHER PUBLICATIONS

Extended European search report for European Patent Application No. 15183627.7, Apr. 6, 2016.

*Primary Examiner* — Calvin Choi
(74) *Attorney, Agent, or Firm* — Shapiro, Gabor and Rosenberger, PLLC

(57) ABSTRACT

To provide a semiconductor device having improved performance while improving the throughput in the manufacturing steps of the semiconductor device. An insulating film portion comprised of first, second, third, fourth, and fifth insulating films is formed on a semiconductor substrate. The second insulating film is a first charge storage film and the fourth insulating film is a second charge storage film. The first charge storage film contains silicon and nitrogen; the third insulating film contains silicon and oxygen; and the second charge storage film contains silicon and nitrogen. The thickness of the third insulating film is smaller than that of the first charge storage film and the thickness of the second charge storage film is greater than that of the first charge storage film. The third insulating film is formed by treating the upper surface of the first charge storage film with a water-containing treatment liquid.

8 Claims, 23 Drawing Sheets

(56) References Cited

U.S. PATENT DOCUMENTS

2007/0166923 A1 7/2007 Shih et al.
2009/0061650 A1 3/2009 Lee et al.
2012/0018792 A1 1/2012 Matsushita et al.

FOREIGN PATENT DOCUMENTS

| | | |
|---|---|---|
| JP | 5-235265 A | 9/1993 |
| JP | 2009-289823 A | 12/2009 |

* cited by examiner

FIG. 31

|  | BASE PROCESS OF MAIN CIRCUIT | BREAKDOWN VOLTAGE (V) | WRITE/ERASE VOLTAGE (V) |
|---|---|---|---|
| INVESTIGATION EXAMPLE 1 | 13V-IO | 13.5 | ±13.5 |
| INVESTIGATION EXAMPLE 2 | 5V-IO | 8.0 | ±13.5 |
| INVESTIGATION EXAMPLE 3 | 3.3V-IO | 5.0 | ±10.0 |
| INVESTIGATION EXAMPLE 4 | 2.5V-IO | 4.0 | ±10.0 |
| INVESTIGATION EXAMPLE 5 | 2.5V-IO | 4.0 | ±8.0 |

METHOD OF MANUFACTURING SEMICONDUCTOR DEVICE

CROSS-REFERENCE TO RELATED APPLICATIONS

The disclosure of Japanese Patent Application No. 2014-201387 filed on Sep. 30, 2014 including the specification, drawings, and abstract is incorporated herein by reference in its entirety.

BACKGROUND

The present invention relates a manufacturing technology of a semiconductor device, for example, a technology effective when applied to a manufacturing technology of a semiconductor device having a nonvolatile memory mix-loaded therein.

Semiconductor devices having a main circuit including MISFET (metal insulator semiconductor field effect transistor) as a field effect transistor sometimes have, in addition to the main circuit for achieving the main function of the semiconductor device, an addition circuit (add-on circuit) added to the main circuit. Examples of the addition circuit include electronic fuses to be used for trimming or relief of the main circuit and memories for storing trimming information therein.

In recent years, there has been an increasing demand for an MTP (multi time program) type electronic fuse that makes use of a programmable nonvolatile memory to allow repeated adjustment. Now, as a memory for storing trimming information, used is a nonvolatile memory (NV memory) having a floating gate structure and suited for mix-loading with a field effect transistor included in a main circuit. Using such a nonvolatile memory increases the size of a memory cell so that a shift to a nonvolatile memory capable of downsizing a memory cell is under investigation. Under such a situation, using, as an addition circuit, a nonvolatile memory having a MONOS (metal oxide nitride oxide semiconductor) structure has been investigated.

Japanese Unexamined Patent Application Publication No. 2009-289823 (Patent Document 1) discloses a technology of a semiconductor integrated circuit device having, in the surface of a semiconductor substrate thereof, a peripheral circuit region and a memory cell region.

Japanese Unexamined Patent Application Publication No. Hei 5(1993)-160095 (Patent Document 2) discloses a technology of washing a semiconductor wafer with pure water added with hydrogen fluoride. Japanese Unexamined Patent Application Publication No. Hei 5(1993-235265) (Patent Document 3) discloses, in a method of manufacturing a semiconductor device, a technology having a step of washing a semiconductor wafer and a step of thermally nitriding a natural oxide film on the washed semiconductor wafer into a corresponding nitride.

[Patent Document 1] Japanese Unexamined Patent Application Publication No. 2009-289823
[Patent Document 2] Japanese Unexamined Patent Application Publication No. Hei 5(1993)-160095
[Patent Document 3] Japanese Unexamined Patent Application Publication No. Hei 5(1993)-235265

SUMMARY

Such a semiconductor device having a nonvolatile memory mix-loaded therein has, as a gate insulating film of a MONOS transistor, an insulating film serving as a bottom oxide film, a charge storage portion comprised of a nitride film, and an insulating film serving as a top oxide film.

When the charge storage portion is comprised of a single layer of a charge storage film, the thickness of an insulating film serving as a bottom oxide film is sometimes decreased so as to enable holes to directly tunnel the insulating film serving as a bottom oxide film and allow erase operation to be performed even a write/erase voltage is decreased. The decrease in the thickness of the insulating film serving as the bottom oxide film however facilitates tunneling of electrons from the charge storage portion to the semiconductor substrate during data retention so that improvement in data retention properties cannot be achieved.

Improvement in data retention properties may be achieved by forming an insulating film made of an ultra-thin oxide film in the middle in the thickness direction of the charge storage portion. It is however difficult to form the insulating film made of an ultra-thin oxide film in the middle in the thickness direction of the charge storage portion with good film-thickness controllability in a short time and it reduces throughput of manufacturing steps of a semiconductor device. Improvement in throughput of manufacturing steps of a semiconductor device while improving the performance of the semiconductor device cannot therefore be achieved easily.

Another problem and novel features will be apparent from the description herein and accompanying drawings.

SUMMARY

In one mode, a method of manufacturing a semiconductor device includes forming, on a semiconductor substrate, an insulating film portion comprised of a first insulating film, a second insulating film on the first insulating film, a third insulating film on the second insulating film, a fourth insulating film on the third insulating film, and a fifth insulating film on the fourth insulating film. Then, after formation of a conductive film on the insulating film portion, the conductive film and the insulating film portion are patterned to form a gate electrode and a gate insulating film. The second insulating film contains silicon and nitrogen, the third insulating film contains silicon and oxygen, and the fourth insulating film contains silicon and nitrogen. The third insulating film has a thickness smaller than that of the second insulating film and the fourth insulating film has a thickness greater than that of the second insulating film. The third insulating film is formed by treating the upper surface of the second insulating film with a water-containing treatment liquid.

According to the one mode, improvement in the performance of a semiconductor device can be achieved while improving the throughput of manufacturing steps of the semiconductor device.

BRIEF DESCRIPTION OF THE DRAWINGS

FIG. 31 is a table for describing the relationship among write/erase voltage, breakdown voltage, and base process of main circuit;

DETAILED DESCRIPTION

Figure 1:
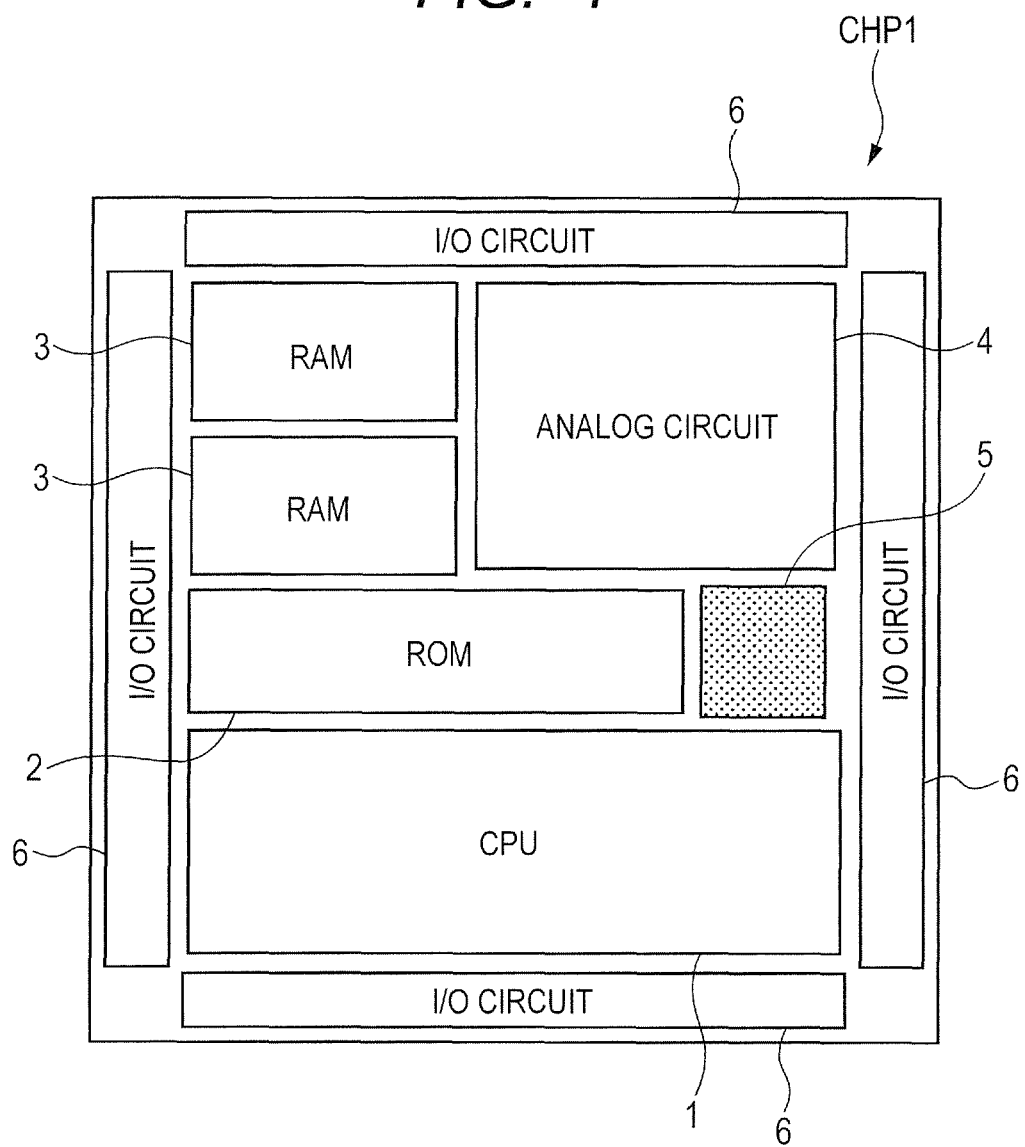
FIG. 1 shows a layout configuration example of a semiconductor chip according to First Embodiment.

In the following embodiments, a description may be made after divided in a plurality of sections or embodiments if necessary for the sake of convenience. These sections or embodiments are not independent from each other unless otherwise particularly specified, but one of them may be a modification example, details, complementary description, or the like of a part or whole of the other one.

In the following embodiments, when a reference is made to the number of elements (including the number, value, amount, range, or the like), the number is not limited to a specific number but may be more or less than the specific number, unless otherwise particularly specified or principally apparent that the number is limited to the specific number.

Further, it is needless to say that in the following embodiments, the constituent component (including component step or the like) is not always essential unless otherwise particularly specified or principally apparent that it is essential.

Similarly, in the following embodiments, when a reference is made to the shape, positional relationship, or the like of the constituent component, that substantially approximate or analogous to it is also embraced unless otherwise particularly specified or principally apparent that it is not. This also applies to the above-mentioned value or range.

In all the drawings for describing the embodiments, the same members will be identified by the same reference numerals and overlapping descriptions will be omitted. Even a plan view may be hatched to facilitate understanding of it.

First Embodiment

The technical concept of First Embodiment relates to a semiconductor device having, in one semiconductor chip, a main circuit for achieving a main function of the semiconductor chip and an addition circuit called "add-on circuit" which is to be added to the main circuit and in this concept, the add-on circuit is comprised of a MONOS type programmable nonvolatile memory.

For example, SOC (system on chip) is taken as an example. Examples of the main circuit include a memory circuit such as DRAM (dynamic random access memory) or SRAM (static random access memory), a logic circuit such as CPU (central processing unit) or MPU (micro processing unit), or a mixed circuit of such a memory circuit and a logic circuit.

On the other hand, examples of the add-on circuit include a memory circuit for storing relatively small capacity information relating to the main circuit and an electronic fuse to be used for relief of a circuit. Examples of the relatively small capacity information include location address information of an element to be used for trimming in a semiconductor chip, location address information of a memory cell to be used for relief of a memory circuit, and product number of a semiconductor device. Examples of the relatively small capacity information when the semiconductor chip is an LCD (liquid crystal display) driver include trimming tap information of an adjusting voltage to be used for LCD image adjustment.

<Layout Configuration Example of Semiconductor Chip>

First Embodiment will be described below using, as an example, a semiconductor chip having a system for achieving a main function. The semiconductor chip in First Embodiment includes a low breakdown voltage MISFET to be driven at a relatively low voltage, a high breakdown voltage MISFET to be driven at a relatively high voltage to allow high-voltage driving, and a programmable nonvolatile memory cell.

The term "breakdown voltage" used in MISFET means a pn junction breakdown voltage generated at a boundary of the MISFET between a source region and a semiconductor substrate (well) or between a drain region and the semiconductor substrate (well) or dielectric breakdown voltage of a gate insulating film. In First Embodiment, a semiconductor substrate has thereon a high breakdown voltage MISFET having a relatively high breakdown voltage and a low breakdown voltage MISFET having a relatively low breakdown voltage.

FIG. 1 shows a layout configuration example of the semiconductor chip of First Embodiment. In FIG. 1, a semiconductor chip CHP1 has a CPU 1, a ROM (read only memory) 2, a RAM 3, an analog circuit 4, a nonvolatile memory 5, and an I/O (input/output) circuit 6.

The CPU 1 is also called a central processing unit and is the heart of a computer. This CPU 1 reads and decodes instructions from a memory device and based on them, performs a variety of operations or controls. It is required to have high-speed processing properties. An MISFET configuring the CPU 1 needs a relatively large current driving force among the elements of the semiconductor chip CHP1. This means that the CPU 1 is comprised of a low breakdown voltage MISFET.

The ROM 2 is a memory in which memory information is unchangeably fixed and is called a read only memory. The ROM has two configuration types, that is, an NAND type in which MISFETs are coupled in series and an NOR type in which MISFETs are coupled in parallel. The NAND type and NOR type are often used for integration degree-oriented purpose and operation rate-oriented purpose, respectively. The ROM 2 is also required to have high speed operation so that MISFETs configuring the ROM 2 need relatively large current driving force. This means that the ROM 2 is comprised of a low breakdown voltage MISFET.

The RAM 3 is a memory capable of reading the stored information at random, which means reading the stored information at any time, or capable of writing the stored information newly. It is also called a random access memory. The RAM 3 as an IC memory has two types, that is, a DRAM (dynamic RAM) using a dynamic circuit and a SRAM (static RAM) using a static circuit. The DRAM is a random access memory which needs memory retaining operation, while the SRAM is a random access memory which does not need memory retaining operation. Since the RAM 3 needs high speed operation, the MISFETs configuring the RAM 3 need relatively large current driving force. This means that the RAM 3 is comprised of a low breakdown voltage MISFET.

The analog circuit 4 is a circuit handling signals of a voltage or current which show a continuous time-dependent change, that is, analog signals. It is comprised of, for example, an amplification circuit, a conversion circuit, a modulation circuit, an oscillation circuit, and a power supply circuit. Such an analog circuit 4 uses a high breakdown voltage MISFET having a relatively high breakdown voltage among the elements of the semiconductor chip CHP1.

The nonvolatile memory 5 is one of nonvolatile memories capable of electrically programming both write operation and erase operation and is also called "electrically erasable programmable read only memory". In First Embodiment, this nonvolatile memory 5 is comprised of a MONOS transistor. The MONOS transistor makes use of, for example, the Fowler-Nordheim tunneling phenomenon for its write operation and erase operation. It can also make use of hot electrons or hot holes for its write operation or erase operation.

When the nonvolatile memory 5 performs write operation, a high potential difference (about 12V) is applied to the MONOS transistor so that a transistor having a relatively high breakdown voltage is necessary as the MONOS transistor.

The I/O circuit 6 is an input/output circuit. It is a circuit for outputting data from the semiconductor chip CHP1 to an apparatus coupled to the outside of the semiconductor chip CHP1 or inputting data from the apparatus coupled to the outside of the semiconductor chip CHP1 to the semiconductor chip CHP1. This I/O circuit 6 is comprised of a high breakdown voltage MISFET having a relatively high breakdown voltage.

In the present embodiment, the main circuit is comprised of the CPU 1, the ROM 2, the RAM 3, and the analog circuit 4, while the add-on circuit is comprised of the nonvolatile memory 5. This means that the semiconductor chip CHP1 of First Embodiment has the main circuit for achieving a main function and the add-on circuit to be added to the main circuit. In First Embodiment, using a MONOS transistor for the add-on circuit can bring the following advantages.

For example, when the add-on circuit includes an electronic fuse and this electronic fuse is comprised of a MONOS transistor which is a programmable nonvolatile memory, a MTP (multi time programmable) type electronic fuse that can be adjusted repeatedly in a wafer form or package form can be achieved.

A nonvolatile memory (NV) memory having a floating gate structure and suited for mix-loading with a field effect transistor included in the main circuit has been used as a memory for storing trimming information, but it increases the size of the memory cell. By using a MONOS transistor instead of the nonvolatile memory (NV memory) having a floating gate structure, the memory cell can be downsized. In addition to these advantages, the MONOS transistor enables programming of data at a low current, leading to reduction in power consumption, because it uses an FN tunneling current for programming of data.

<Constitution of Circuit Block of Nonvolatile Memory>

Figure 2:
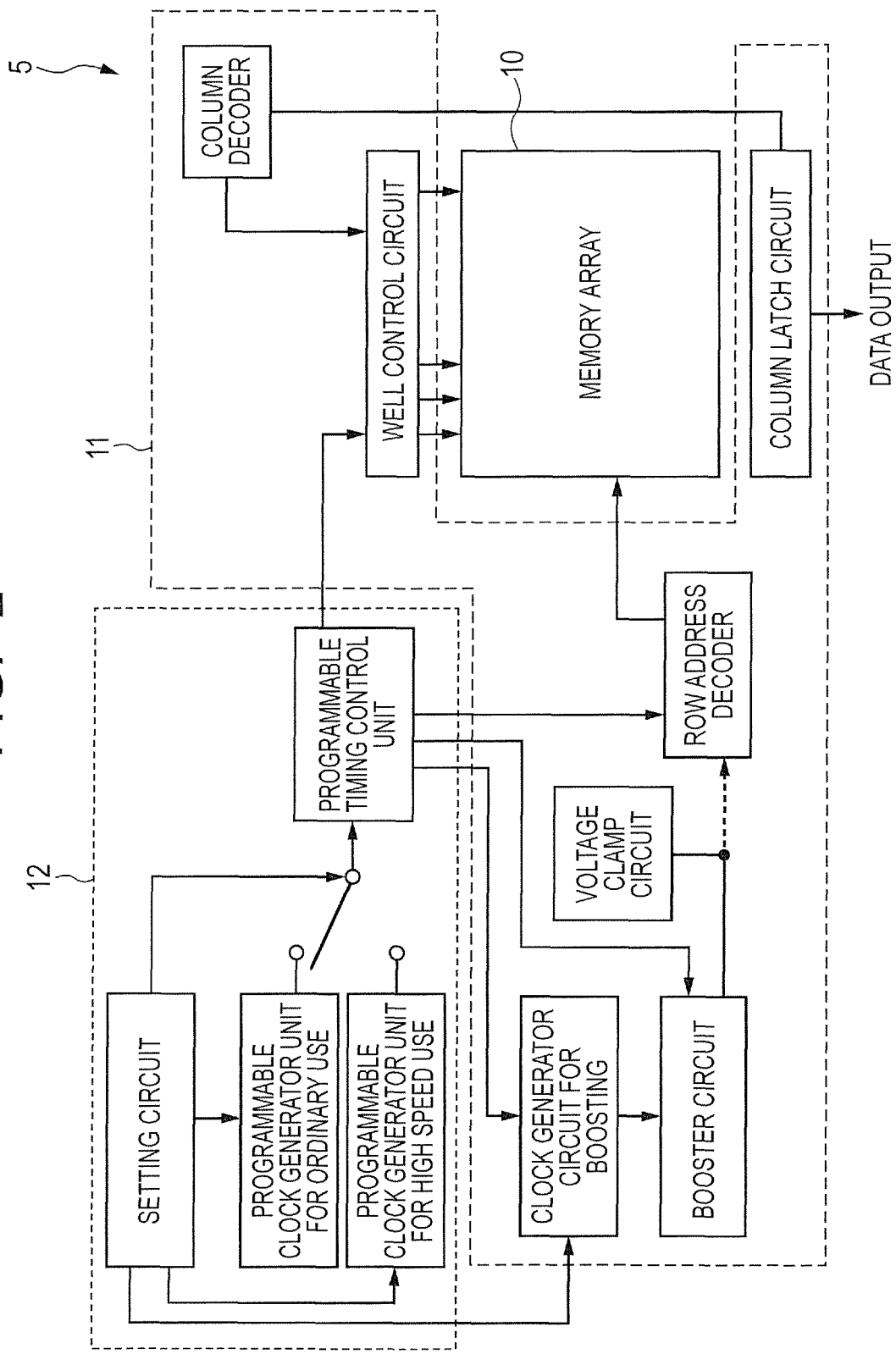
FIG. 2 shows one example of a circuit block configuration of a nonvolatile memory.

Next, FIG. 2 shows one example of the circuit block configuration of the nonvolatile memory. In FIG. 2, the nonvolatile memory 5 has a memory array 10, a direct peripheral circuit portion 11 and an indirect peripheral circuit portion 12.

The memory array 10 is a memory portion of the nonvolatile memory 5, and it has a number of memory cells arranged two-dimensionally in rows and columns (in array form). Each memory cell is a circuit for storing 1 bit as a unit of information and it is comprised of a MONOS transistor which is a memory portion.

The direct peripheral circuit portion 11 is a circuit for driving the memory array 10, that is, a drive circuit and it has, for example, a booster circuit for boosting a voltage level by several times from a power supply voltage, a clock generator circuit for boosting, a voltage clamp circuit, a column decoder or row address decoder for selecting a column or a row, a column latch circuit, a WELL control circuit, and the like. MISFETs configuring the direct peripheral circuit portion 11 are comprised of high breakdown voltage MISFETs that require a relatively high breakdown voltage, among the elements which the semiconductor chip CHP1 has.

The indirect peripheral circuit portion 12 is a programmable control circuit of the memory array and it is comprised of a setting circuit, a programmable clock generator unit for ordinary use, a programmable clock generator unit for high speed use, a programmable timing control unit, and the like. MISFETs configuring the indirect peripheral circuit portion 12 are comprised of low breakdown voltage MISFETs which can be driven at a relatively low voltage and can be operated at high speed, among the elements which the semiconductor chip CHP1 has.

<Structure of Semiconductor Device>

Figure 3:
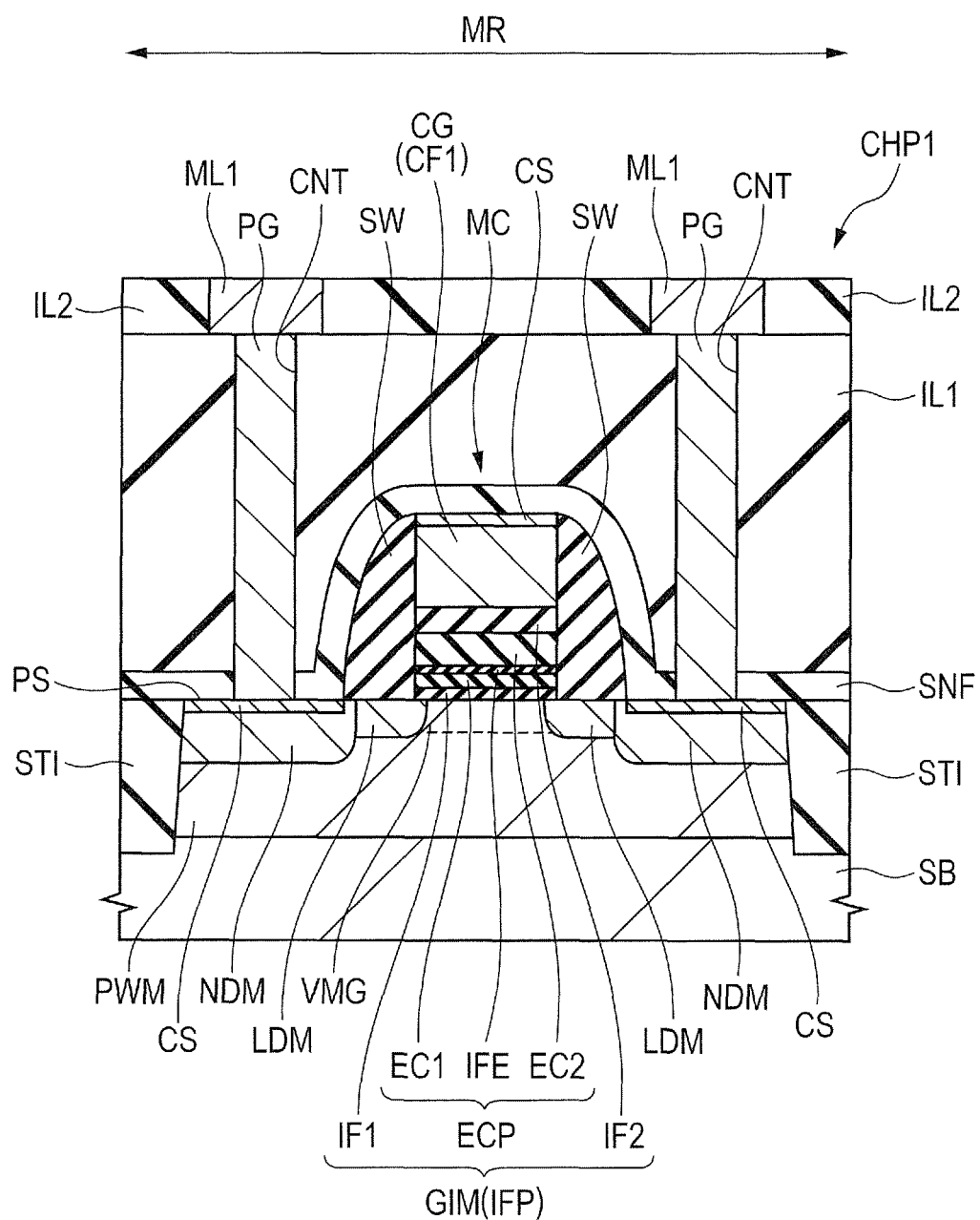
FIG. 3 is a fragmentary cross-sectional view of a semiconductor device of First Embodiment.
Figure 4:
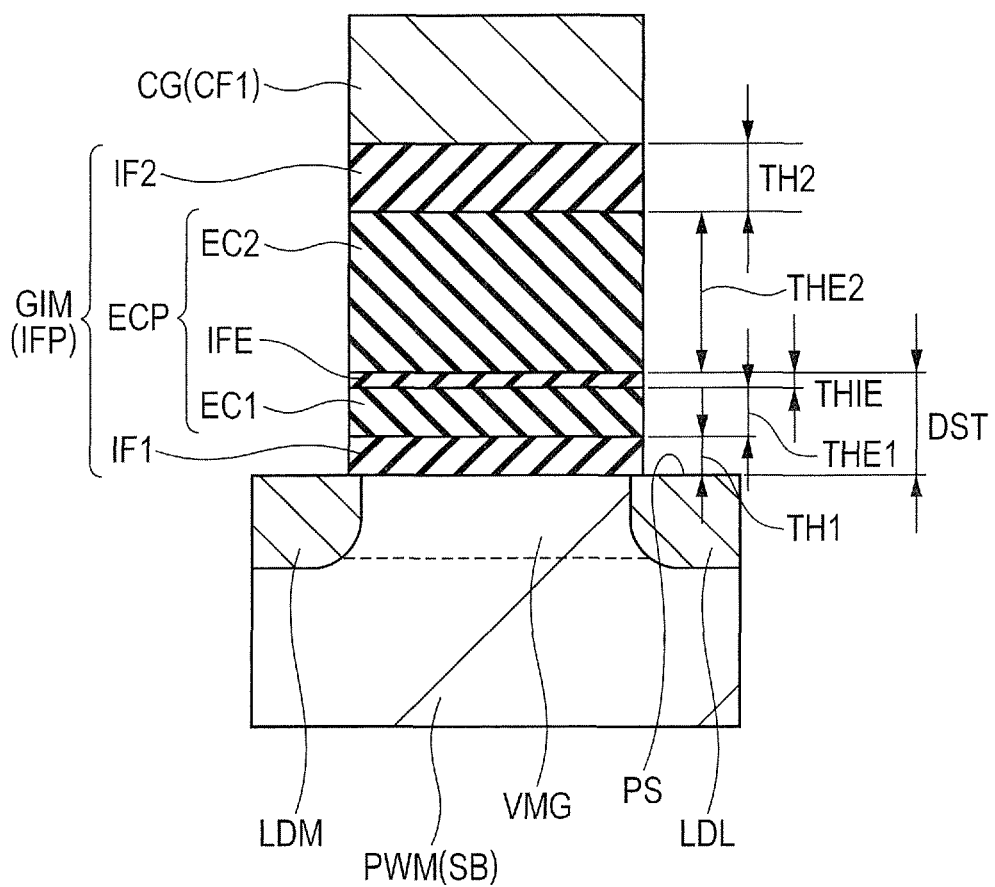
FIG. 4 is a fragmentary cross-sectional view of the semiconductor device of First Embodiment.

Next, the structure of the semiconductor chip CHP1 as the semiconductor device of First Embodiment will be described referring to some drawings. FIGS. 3 and 4 are fragmentary cross-sectional views of the semiconductor device of First Embodiment. Of these fragmentary cross-sectional views of the semiconductor device of First Embodiment, FIG. 4 is an enlarged cross-sectional view showing the periphery of a gate insulating film GIM. In order to facilitate understanding, FIG. 4 omits portions on a MONOS transistor MC such as interlayer insulating film IL1, and a silicide film CS.

As shown in FIG. 3, the semiconductor chip CHP1 as the semiconductor device of First Embodiment has a memory formation region MR.

Although not shown in this drawing, the semiconductor chip CHP1 has also a main circuit formation region. The main circuit formation region not shown in this drawing has therein a low breakdown voltage MISFET requiring a large current driving force to enable high-speed operation. A region in which the low breakdown voltage MISFET is to be formed may be, for example, a formation region of CPU 1, ROM 2, or RAM 3. The low breakdown voltage MISFET operates at a power supply voltage of, for example, about 1.5V.

The main circuit formation region not shown also has therein a high breakdown voltage MISFET. The high breakdown voltage MISFET formation region has therein a high breakdown voltage MISFET. A region in which such a high breakdown voltage MISFET is to be formed may be, for example, a formation region of the analog circuit 4 or a region in which the I/O circuit 6 is formed. The high breakdown voltage MISFET operates at a power supply voltage of, for example, about 5V.

The memory formation region MR has therein a memory cell of the nonvolatile memory 5 shown in FIG. 1 and this memory cell is comprised of a MONOS transistor MC.

As shown in FIG. 3, the semiconductor chip CHP1 has a semiconductor substrate SB and the semiconductor substrate SB has, in an upper surface PS thereof as a main surface, an element isolation region STI for isolating elements from each other. An active region isolated by the element isolation region ST is a memory formation region MR. This means that the memory formation region MR is a region of a part of the upper surface PS of the semiconductor substrate SB. In the memory formation region MR, the semiconductor substrate SB has, on the side of the upper surface PS thereof, a p well PWM. The p Well PWM has, in the upper layer portion thereof, that is, a portion in which a channel region is formed, a p type semiconductor region VMG.

The term "p type" means a conductivity type in which a main charge carrier is a hole.

Next, the MONOS transistor MC shown in FIG. 3 will be described. The MONOS transistor MC has the p well PWM, the p type semiconductor region VMG, a gate insulating film GIM, a gate electrode CG, a sidewall spacer SW, an $n^-$ type semiconductor region LDM, and an $n^+$ type semiconductor region NDM. This means that the nonvolatile memory is comprised of the gate electrode CG and the gate insulating film GIM. In the nonvolatile memory, a voltage is applied to between the semiconductor substrate SB and the gate electrode CG, electrons are injected into the gate insulating film GIM from the p well PWM of the semiconductor substrate SB, that is, from the p type semiconductor region VMG, and thus, data are written. On the other hand, in the nonvolatile memory, a voltage is applied to between the semiconductor substrate SB and the gate electrode CG, holes are injected into the gate insulating film GIM from the p well PWM of the semiconductor substrate SB, that is, from the p type semiconductor region VMG, and thus data are erased.

The "$n^-$ type" and "$n^+$ type" are conductivity types of members having, as a main charge carrier, electrons and these conductivity types are opposite to a p type.

The semiconductor substrate SB has, on the upper surface PS side thereof, the p well PWM and the p well PWM has thereon the gate insulating film GIM comprised of an insulating film portion IFP. This means that the gate insulating film GIM lies in the upper surface PS of the semiconductor substrate SB. The gate insulating film GIM has thereon the gate electrode CG comprised of a conductive film CF1. The gate electrode CG, that is, the conductive film CF1 is made of, for example, a polysilicon film.

The gate electrode CG has, on both side surfaces thereof, a sidewall spacer SW as a side wall portion made of, for example, an insulating film for forming an LDD (lightly doped drain) structure. A portion of the p well PWM located below the sidewall spacer SW has, in an upper layer portion, the $n^-$ type semiconductor region LDM and in plan view, a portion of the p well PWM located outside the $n^-$ type semiconductor region LDM has, in an upper layer portion thereof, the $n^+$ type semiconductor region NDM. The $n^+$ type semiconductor region NDM is in contact with the $n^-$ type semiconductor region LDM and the $n^+$ type semiconductor region NDM has an impurity concentration higher than that of the $n^-$ type semiconductor region LDM. A portion of the p well PWM located rightly below the gate insulating film GIM has, in an upper layer portion thereof, a channel region. The gate electrode CG and the $n^+$ type semiconductor region NDM each have, in the upper surface thereof, a silicide film CS for achieving resistance reduction.

The sidewall spacer SW serves to allow a source region and a drain region, which are semiconductor regions of the MONOS transistor MC, to have an LDD structure. This means that the source region and the drain region of the MONOS transistor MC are each comprised of the $n^-$ type semiconductor region LDM and the $n^+$ type semiconductor region NDM. By forming the n⁻ type semiconductor region LDM as a portion of the source region below the gate electrode CG and as a portion of the drain region below the end portion of the gate electrode CG, field concentration under the end portion of the gate electrode CG can be suppressed.

The gate insulating film GIM includes an insulating film IF1 formed on the upper surface PS of the semiconductor substrate SB, a charge storage film EC1 as an insulating film formed on the insulating film IF1, an insulating film IFE formed on the charge storage film EC1, a charge storage film EC2 as an insulating film formed on the insulating film IFE, and an insulating film IF2 formed on the charge storage film EC2. The insulating film IF1 is an insulating film as a bottom oxide film. The charge storage film EC1, the insulating film IFE, and the charge storage film EC2 configure a charge storage portion ECP. The insulating film IF2 is an insulating film as a top oxide film. The insulating film IF1, the charge storage portion ECP, and the insulating film IF2 configure the insulating film portion IFP. As described above, therefore, the gate insulating film GIM is comprised of the insulating film portion IFP.

The charge storage film EC1 is a first charge storage portion for accumulating charges therein, while the charge storage film EC2 is a second charge storage portion for accumulating charges therein. As will be described later referring to FIG. 24, a band gap of each of the insulating films IF1, IFE, and IF2 is greater than the band gap of each of the charge storage films EC1 and EC2 and the charge storage films EC1 and EC2 have, in the band gap thereof, an electron trap position such as impurity level. In such a case, the charge storage films EC1 and EC2 can store charges therein.

The insulating film IF1 is an insulating film containing silicon and oxygen and is made of, for example, silicon oxide. The charge storage film EC1 is an insulating film containing silicon and nitrogen and is made of, for example, silicon nitride. The insulating film IFE is an insulating film containing silicon and oxygen and is made of, for example, silicon oxide or silicon oxynitride. The charge storage film EC2 is an insulating film containing silicon and nitrogen and is made of, for example, silicon nitride. The insulating film IF2 is an insulating film containing silicon and oxygen and is made of, for example, silicon oxide. Such a configuration can satisfy the above-mentioned magnitude relationship of the band gaps.

The thickness THE2 of the charge storage film EC2 is greater than the thickness THE1 of the charge storage film EC1. This makes it possible to make the thickness of the insulating film IFE smaller than the thickness THE1 of the charge storage film EC1 placed on the side closer to the semiconductor substrate SB with respect to the center position in the thickness direction of the charge storage portion ECP.

The insulating film IFE is provided mainly for improving the data retention properties. On the other hand, a charge injection efficiency is in a trade-off relationship with data retention properties. In the memory cell of First Embodiment, by making the thickness THE1 of the charge storage film EC1 smaller than the thickness THE2 of the charge storage film EC2, charges can be injected from the substrate side to the charge storage film EC2 with improved efficiency even when the insulating film IFE is provided.

The thickness THIE of the insulating film IFE is smaller than the thickness THE1 of the charge storage film EC1. This enables the insulating film IFE to have a smaller thickness THIE. As a result, electrons or holes can be tunneled through the insulating film IF1, the charge storage film EC1, and the insulating film IFE and injected easily from the semiconductor substrate SB to the charge storage film EC2.

The thickness THIE of the insulating film IFE is smaller than the thickness TH1 of the insulating film IF1. The insulating film IF1 can therefore have a sufficient thickness as a bottom oxide film.

In FIG. 4, the thickness of the insulating film IF2 is indicated by thickness TH2.

The semiconductor substrate SB has thereon an insulating film SNF so as to cover the MONOS transistor MC therewith. The insulating film SNF is made of, for example, silicon nitride.

The insulating film SNF has thereon an interlayer insulating film IL1. The interlayer insulating film IL1 is, for example, an insulating film made of silicon oxide or a stacked film of an insulating film made of silicon nitride and an insulating film made of silicon oxide. The interlayer insulating film IL1 has a planarized upper surface.

The interlayer insulating film IL1 has a contact hole CNT therein and the contact hole CNT is filled with a plug PG comprised of a conductor film. The plug PG is comprised of a thin barrier conductor film formed on the bottom portion and the side wall, that is, side surface of the contact hole CNT and a main conductor film formed on this barrier conductor film to fill the contact hole CNT. To simplify FIG. 3, the barrier conductor film and the main conductor film configuring the plug PG is shown as one film. As the barrier conductor film configuring the plug PG, for example, a titanium (Ti) film or a titanium nitride (TiN) film or a stacked film of them may be used, while as the main conductor film configuring the plug PG, for example, a tungsten (W) film may be used.

The plug PG lies on the n⁺ type semiconductor region NDM. Although not shown in the drawing, it lies also on the gate electrode CG. The plug PG is electrically coupled to the n⁺ type semiconductor region NDM. Although not shown in this drawing, it is also electrically coupled to the gate electrode CG.

The interlayer insulating film IL1 having the plug PG buried therein has an interlayer insulating film IL2 thereon and a wiring trench formed in the interlayer insulating film IL2 has therein a first-layer wiring ML1 as a damascene buried wiring made of, for example, copper (Cu) as a main conductive material. The first-layer wiring has thereon upper-layer wirings as damascene wiring, but illustration and description on them are omitted here. The first-layer wiring and wirings thereover are not limited to damascene wirings and can also be formed by patterning a wiring conductive film. For example, it may be a tungsten (W) wiring or aluminum (Al) wiring instead.

<Operation of Nonvolatile Memory>

The semiconductor device of First Embodiment has the above-described configuration. Operation of a memory cell (nonvolatile memory cell) included in this semiconductor device will next be described.

Figure 5:
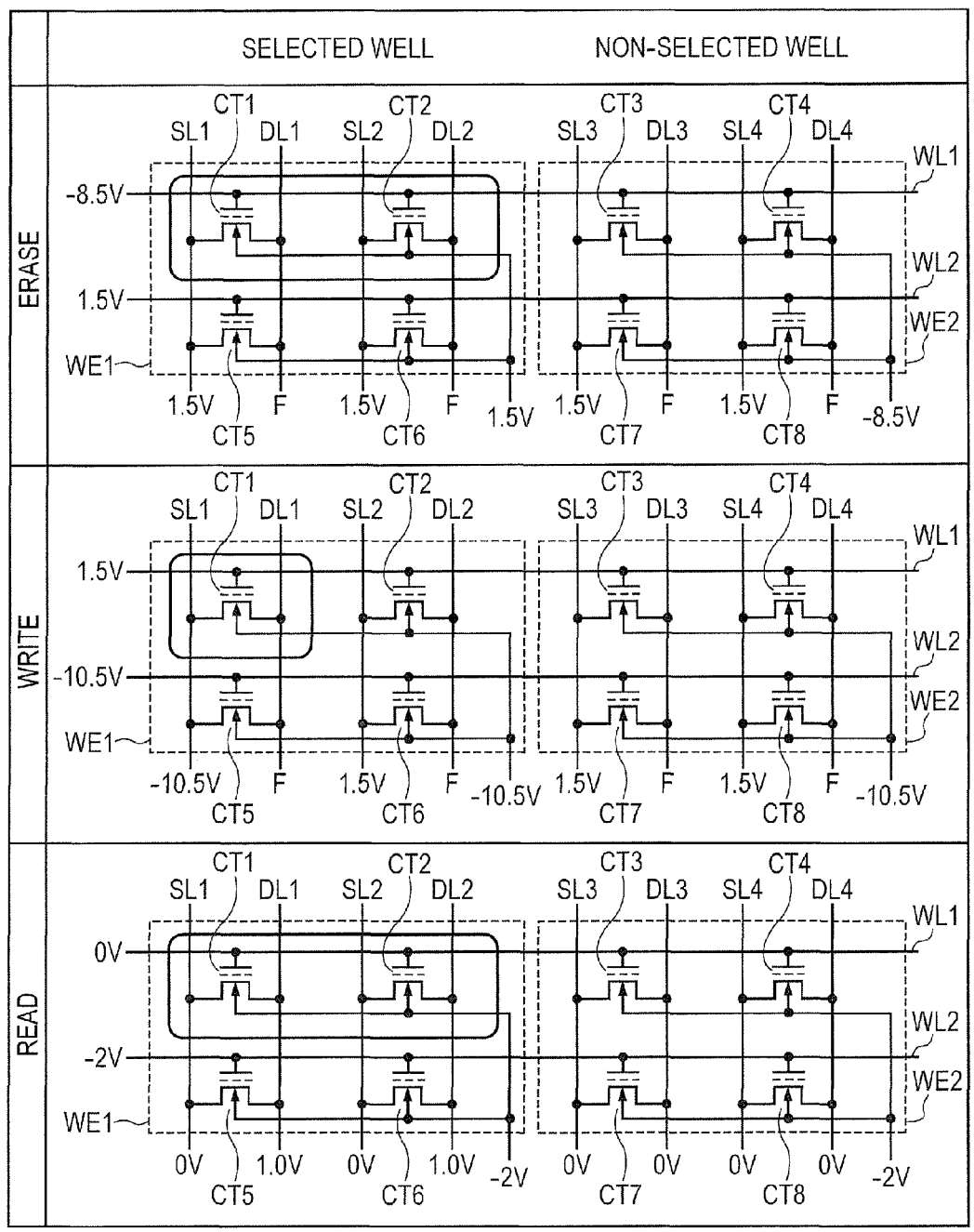
FIG. 5 is an explanatory view showing one example of a memory array structure of a nonvolatile memory and operation conditions thereof.

FIG. 5 is an explanatory view showing one example of the memory array structure and operation conditions (1 cell/1 transistor) of the nonvolatile memory. Cell transistors CT1 to CT8 in FIG. 5 each correspond to a memory cell comprised of the MONOS transistor MC shown in FIG. 3. The gate electrode of each of the cell transistors CT1 to CT4 is coupled to a word line WL1 and the gate electrode of each of the cell transistors CT5 to CT8 is coupled to a word line WL2.

The source region of each of the cell transistors CT1 and CT5 is coupled to a source line SL1, and the source region of each of the cell transistor CT2 and CT6 is coupled to a source line SL2. The source region of each of the cell transistors CT3 and CT7 is coupled to a source line SL3 and the source region of each of the cell transistors CT4 and CT8 is coupled to a source line SL4.

The drain region of each of the cell transistors CT1 and CT5 is coupled to a data line DL1 and the drain region of each of the cell transistors CT2 and CT6 is coupled to a data line DL2. The drain region of each of the cell transistors CT3 and CT7 is coupled to a data line DL3 and the drain region of each of the cell transistors CT4 and CT8 is coupled to a data line DL4.

The back gate of each of the cell transistors CT1, CT2, CT5, and CT6 is coupled to a well WE1 and the back gate of each of the cell transistors CT3, CT4, CT7, and CT8 is coupled to a well WE2.

To simplify the description, memory cells arranged in two rows and four columns are shown in FIG. 5, but they are not limited thereto. More memory cells are arranged in matrix form and configure an actual memory array. In FIG. 5, the memory cell arrangement which shares the same well and the same word line is two-column configuration of, for example, the cell transistors CT1 and CT2. In an 8-bit (1 byte) configuration, one well has thereon eight columns of cell transistors. In this case, erase and write of the memory cell are performed byte by byte.

Next, referring to FIG. 5, erase, write, and read operations of a 1 cell/1 transistor type memory cell will be described.

First, the erase operation will be described. For example, supposing that as a memory cell from which data are to be erased (selected memory cell), the cell transistors CT1 and CT2 are subjected to erasure of data stored therein. The potentials of the selected well WE1, word line WL1, source lines SL1 and SL2, and data lines DL1 and DL2 are set at 1.5V, −8.5V, 1.5V, and floating potential (indicated by F in FIG. 5), respectively. The charges stored in the charge storage film of the cell transistors CT1 and CT2 are then withdrawn to the semiconductor substrate side and the data are erased.

With regard to the cell transistors CT3 to CT8 as the other memory cells from which data are not erased (non-selected memory cells), the potentials of the non-selected well WE2, word line WL2, source lines SL3 and SL4, and data lines DL3 and DL4 are set at −8.5V, 1.5V, 1.5V, and floating potential, respectively. Escape of the charges stored in the charge storage film of the cell transistors CT3 to CT8 is thus prevented, whereby the data are not erased.

Next, the write operation will be described. For example, supposing that as the memory cell in which data are to be written (selected memory cell), the cell transistor CT1 is subjected to data writing. The potentials of the selected well WE1, word line WL1, source line SL1, and data line DL1 are set at −10.5V, 1.5V, −10.5V, and floating potential, respectively. The charges are then injected into the charge storage film of the cell transistor CT1 and the data are written therein.

With regard to the other cell transistors CT2 to CT8 in which data are not written (non-selected memory cells), the potentials of the non-selected well WE2, word line WL2, source lines SL2 to SL4, and data lines DL2 to DL4 are set at −10.5V, −10.5V, 1.5V, and floating potential, respectively. Injection of charges into the charge storage film of the cell transistors CT2 to CT8 is thus prevented.

Next, read operation will be described. For example, supposing that the cell transistor CT1 in which data "0" has been written has an increased threshold voltage, while the cell transistor CT2 having data "1" has a lowered threshold voltage. When the data are read out from the cell transistors CT1 and CT2, the potentials of the selected well WE1, word line WL1, source lines SL1 and SL2, and data lines DL1 and DL2 are set at −2V, 0V, 0V and 1.0V, respectively. In such a manner, the data are read out from the cell transistors CT1 and CT2. In this case, since the threshold voltage of the cell transistor CT1 is high and that of the cell transistor CT2 is low, the potential of the data line DL2 lowers without a change in the potential of the data line DL1.

With regard to the other memory cells CT3 to CT8 from which no data are read out, the potentials of the non-selected well WE2, word line WL2, source lines SL3 and SL4, and data lines DL3 and DL4 are set at −2V, −2V, 0V and 0V, respectively, whereby the cell transistors CT3 to CT8 are prevented from being turned ON. By decreasing the back gate potential of the non-selected memory cell during read operation, the memory cell does not need a selected transistor.

<Method of Manufacturing Semiconductor Device>

Next, a method of manufacturing a semiconductor device according to First Embodiment will be described.

Figure 6:
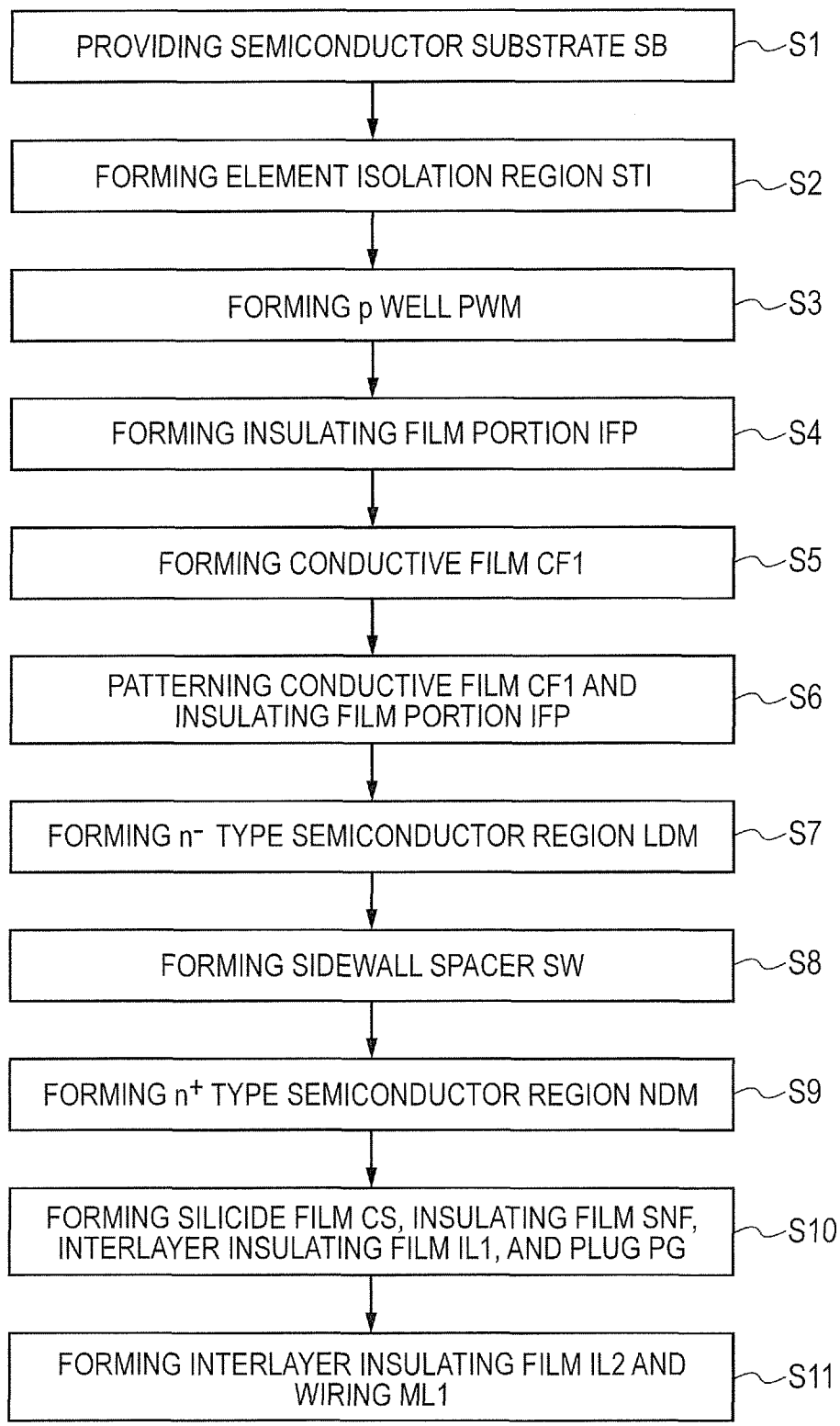
FIG. 6 is a process flow chart showing some of manufacturing steps of the semiconductor device of First Embodiment.
Figure 7:
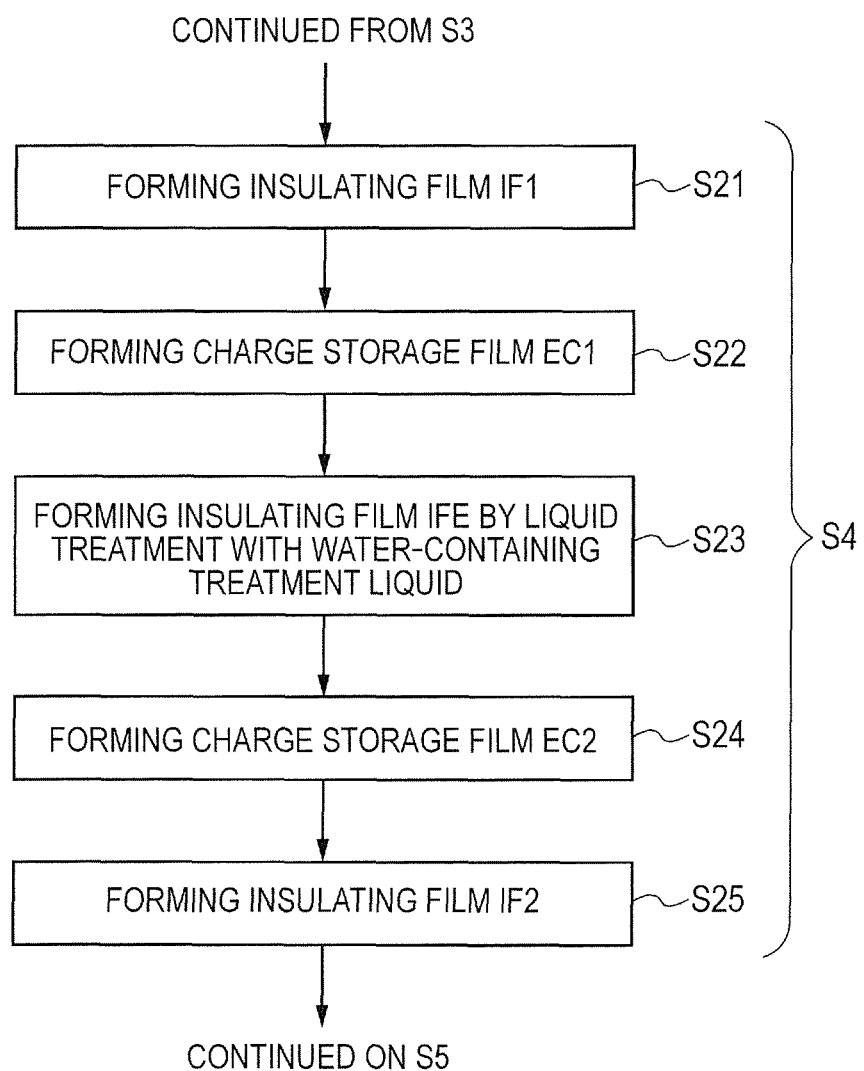
FIG. 7 is a process flow chart showing some of manufacturing steps of the semiconductor device of First Embodiment.

FIGS. 6 and 7 are process flow charts showing some manufacturing steps of the semiconductor device of First Embodiment. FIGS. 8 to 19 are fragmentary cross-sectional views of the semiconductor device of First Embodiment during manufacturing steps. FIG. 7 shows a step included in Step S4 of FIG. 6. FIGS. 9, 11, 13, 15, and 17 are, among the fragmentary cross-sectional view of the semiconductor device of First Embodiment, enlarged cross-sectional views showing the periphery of a region where the gate insulating film GIM is to be formed. In FIGS. 9, 11, 13, 15, and 17, to facilitate understanding, a portion on the MONOS transistor MC such as the interlayer insulating film IL1, and the silicide film CS are omitted from the drawing.

In First Embodiment, formation of an n channel type MONOS transistor in the memory formation region MR is described, but a p channel type MONOS transistor MC having a conductivity type opposite to the n channel type can be formed (which will similarly apply to the following embodiment) instead.

Figure 8:
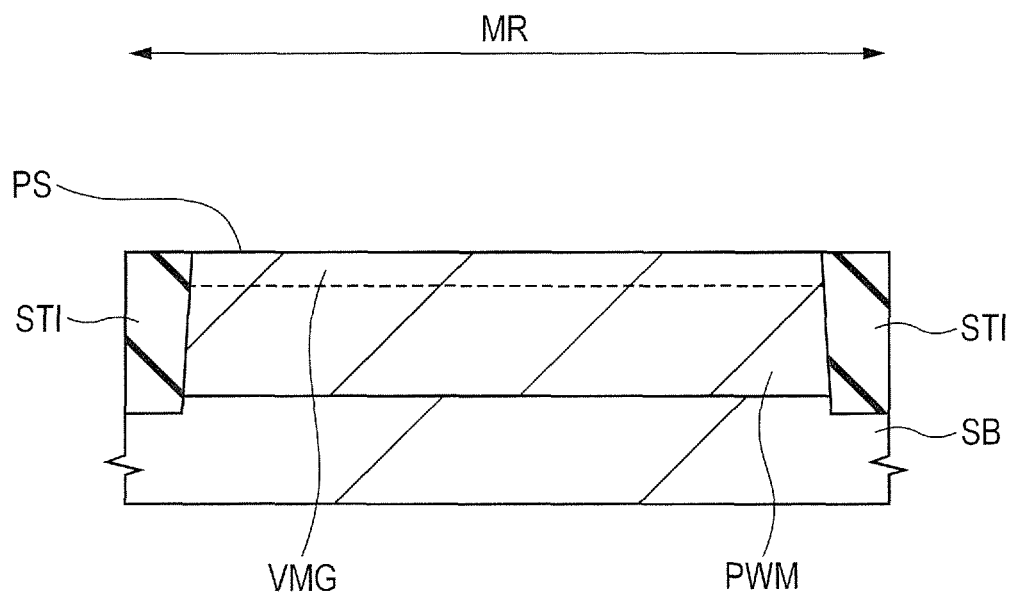
FIG. 8 is a fragmentary cross-sectional view of the semiconductor device of First Embodiment during a manufacturing step thereof.

First, as shown in FIG. 8, a semiconductor substrate SB is provided (Step S1 in FIG. 6). In this step S1, a semiconductor substrate SB having, for example, a p type impurity such as boron (B) introduced therein and made of, for example, a silicon single crystal having a specific resistance of from about 1 to 10 Ωcm is provided. The semiconductor substrate SB at this time is in a form of a semiconductor wafer having a substantially disk shape.

Next, as shown in FIG. 8, an element isolation region STI is formed (Step S2 in FIG. 6). In this step S2, an element isolation region STI is formed, for example, using STI (shallow trench isolation) or LOCOS (local oxidation of Si). A method of forming the element isolation region STI by STI will be described below.

In STI, first, an element isolation trench is formed in the semiconductor substrate SB by using photolithography and etching. Then, an insulating film made of, for example, a silicon oxide film is formed on the semiconductor substrate SB so as to fill the element isolation trench. Chemical mechanical polishing (CMP) is then performed to remove an unnecessary portion of the insulating film formed on the semiconductor substrate SB. This makes it possible to fill only the element isolation trench with the insulating film and thereby form the element isolation region STI.

Figure 9:
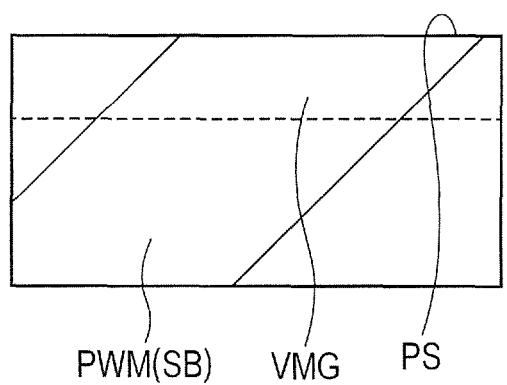
FIG. 9 is a fragmentary cross-sectional view of the semiconductor device of First Embodiment during a manufacturing step thereof.

Next, as shown in FIGS. 8 and 9, a p well PWM is formed (Step S3 in FIG. 6).

In this Step S3, as shown in FIGS. 8 and 9, a p type impurity, for example, boron (B) is introduced into the semiconductor substrate SB, for example, by ion implantation with a patterned resist film (not shown) as a mask.

In this step S3, as shown in FIGS. 8 and 9, for example, a p type impurity such as boron (B) is ion-implanted into the semiconductor substrate SB to form a p type semiconductor region VMG in an upper layer portion of the p well PWM in the memory formation region MR, that is, in a portion where a channel region is to be formed. At this time, the implantation energy of the p type impurity ion may be set at, for example, about 20 KeV and the dose may be set at, for example, about $1.5 \times 10^{13}$ cm$^{-2}$. The threshold voltage of the MONOS transistor MC can be controlled by regulating the kind of the impurity to be ion-implanted or ion implantation conditions.

The term "n type" is a conductivity type opposite to a p type and n type members have electrons as a main charge carrier thereof.

Next, as shown in FIGS. 10 to 15, an insulating film portion IFP is formed (Step S4 in FIG. 6).

The insulating film portion IFP includes an insulating film IF1 formed on an upper surface PS of the semiconductor substrate, a charge storage film EC1 as an insulating film formed on the insulating film IF1, an insulating film IFE formed on the charge storage film EC1, a charge storage film EC2 as an insulating film formed on the insulating film IFE, and an insulating film IF2 formed on the charge storage film EC2. The insulating film IF1 is an insulating film as a bottom oxide film. The charge storage film EC1, the insulating film IFE, and the charge storage film EC2 configure a charge storage portion ECP. The insulating film IF2 is an insulating film as a top oxide film. The charge storage film EC1 is a first charge storage portion for storing charges therein and the charge storage film EC2 is a second charge storage portion for storing charges therein.

The Step S4 in FIG. 6 includes a step (Step S21 in FIG. 7) of forming the insulating film IF1 on the upper surface PS of the semiconductor substrate SB, a step (Step S22 in FIG. 7) of forming the charge storage film EC1 on the insulating film IF1, and a step (Step S23 in FIG. 7) of forming the insulating film IFE on the charge storage film EC1. The Step S4 of FIG. 6 includes a step (Step S24 in FIG. 7) of forming the charge storage film EC2 on the insulating film IFE and a step (Step S25 in FIG. 7) of forming the insulating film IF2 on the charge storage film EC2.

Figure 10:
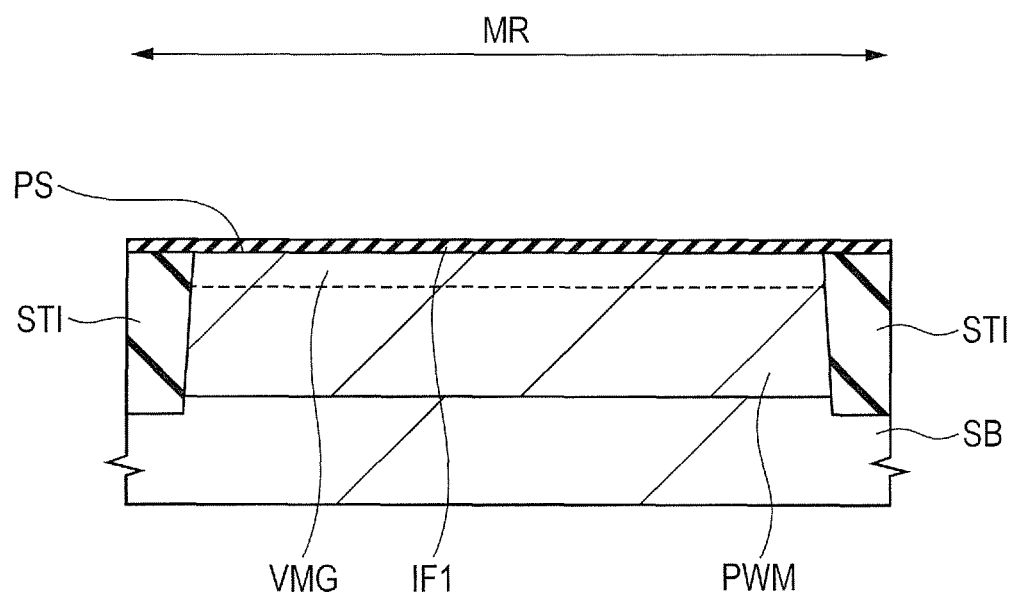
FIG. 10 is a fragmentary cross-sectional view of the semiconductor device of First Embodiment during a manufacturing step thereof.
Figure 11:
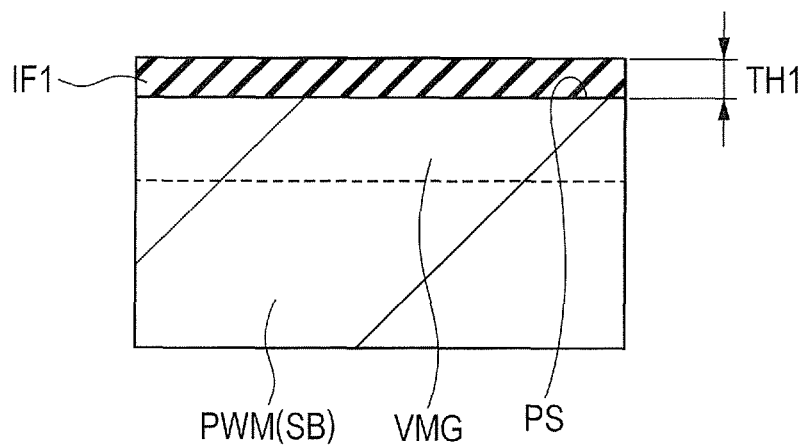
FIG. 11 is a fragmentary cross-sectional view of the semiconductor device of First Embodiment during a manufacturing step thereof.

First, as shown in FIGS. 10 and 11, the insulating film IF1 is formed (Step S21 in FIG. 7). In this Step S21, the insulating film IF1 is formed on the upper surface PS of the semiconductor substrate SB, that is, on the p well PWM, in the memory formation region MR.

The insulating film IF1 is an insulating film containing silicon and oxygen and it is made of, for example, silicon oxide. The insulating film IF1 can be formed, preferably, by ISSG (in situ steam generation) oxidation. ISSG oxidation is a method of directly introducing hydrogen and oxygen into a pressure-reduced thermal treatment chamber, causing a radical oxidation reaction, for example, on the surface of a semiconductor substrate which is made of silicon and heated to, for example, a temperature of from 800 to 1100° C., and thereby forming an oxide film made of, for example, silicon oxide on the surface of the semiconductor substrate. Oxidation power in ISSG oxidation is higher than that in, for example, thermal oxidation because it uses a radical oxidation reaction. The insulating film IF1 obtained by using ISSG oxidation, therefore, is made of silicon oxide, is densified, and has a good film quality. The insulating film IF1 has a thickness TH1 of, for example, about 2 nm.

Figure 12:
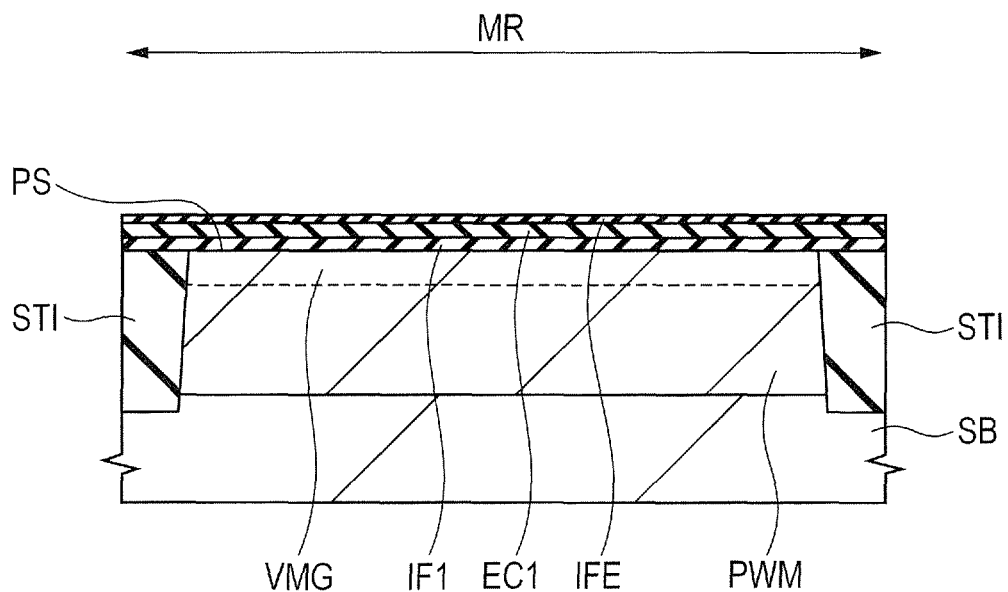
FIG. 12 is a fragmentary cross-sectional view of the semiconductor device of First Embodiment during a manufacturing step thereof.
Figure 13:
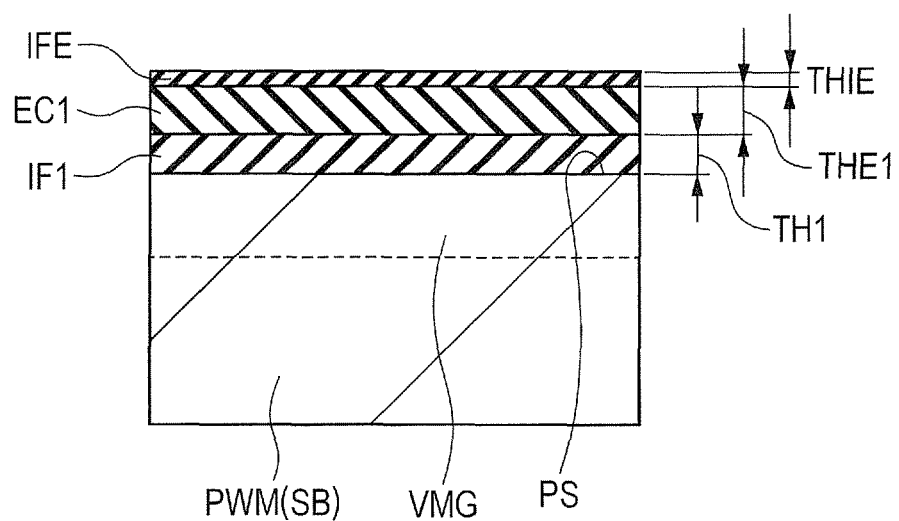
FIG. 13 is a fragmentary cross-sectional view of the semiconductor device of First Embodiment during a manufacturing step thereof.

Next, as shown in FIGS. 12 and 13, the charge storage film EC1 is formed (Step S22 in FIG. 7). In this Step S22, the charge storage film EC1 is formed on the insulating film IF1 in the memory formation region MR.

The charge storage film EC1 is an insulating film containing silicon and nitrogen and is made of, for example, silicon nitride. The charge storage film EC1 can be formed, for example, by chemical vapor deposition (CVD), preferably, low pressure chemical vapor deposition (LPCVD) using, for example, a dichlorosilane ($SiH_2Cl_2$) gas and an ammonia ($NH_3$) gas as a raw material gas. Alternatively, the charge storage film EC1 can be formed by LPCVD using, for example, a silane ($SiH_4$) gas and an ammonia gas as a raw material gas. The charge storage film EC1 has a thickness THE1 of, for example, about 2 nm.

The charge storage film EC1 can be formed by atomic layer deposition (ALD). In ALD, a step of causing chemical adsorption of molecules of a precursor gas to form one atomic layer and a step of purging the excess molecules of the precursor gas to remove them are repeated alternately to stack the resulting atomic layers one by one to form a film. In LPCVD, a temperature of 600° C. or more is usually necessary for forming the charge storage film EC1 which is homogeneous and made of, for example, silicon nitride, but in ALD, the charge storage film EC1 which is homogeneous can be formed even at a temperature less than 600° C., for example, a temperature as low as about 400° C. or less.

Further, when the charge storage film EC1 made of, for example, silicon nitride is formed by ALD, bonding strength between silicon and nitrogen can be adjusted so as not to be high by controlling, for example, processing conditions. In such a case, in Step S23 which will be described later, the insulating film IFE made of, for example, silicon oxide or silicon oxynitride can be formed easily by liquid treatment with a water-containing treatment liquid, that is, by wet treatment.

By using plasma-enhanced chemical vapor deposition (PECVD) instead of ALD, the charge storage film EC1 made of, for example, silicon nitride can be formed at a temperature as low as less than 600° C., that is, a film forming temperature in LPCVD or thermal CVD, for example, at a temperature of 400° C. A film forming apparatus for forming a charge storage film EC1 at a temperature as low as less than 600° C. will hereinafter be called "reduced-temperature film forming apparatus" and a film formed using such a reduced-temperature film forming apparatus and containing silicon and nitrogen will hereinafter be called "reduced-temperature nitride film". In Step S22, the charge storage film EC1 as the reduced-temperature nitride film is formed at a temperature as low as less than 600° C., for example, at about 400° C. by using the reduced-temperature film forming apparatus.

Next, as shown in FIGS. 12 and 13, the insulating film IFE is formed by the liquid treatment using a water-containing treatment liquid, that is, wet treatment (Step S23 in FIG. 7). In this Step S23, the insulating film IFE is formed on the charge storage film EC1 in the memory formation region MR. The insulating film IFE is an insulating film containing silicon and oxygen and is made of, for example, silicon oxide or silicon oxynitride. A method of liquid-treating, that is, wet treating a semiconductor substrate one by one by using a single wafer liquid treatment apparatus will hereinafter be described.

First, the semiconductor substrate SB after Step S22 is supported by a wafer stage (not shown) provided in the liquid treatment apparatus (not shown). Next, pure water kept, for example, at room temperature, that is, 23° C. is supplied as a treatment liquid for, for example, about 30 seconds to the upper surface PS of the semiconductor substrate SB from a nozzle (not shown) provided in the liquid treatment apparatus while rotating the semiconductor substrate SB together with the wafer stage. With the treatment liquid thus supplied, the upper surface of the charge storage film EC1 made of, for example, silicon nitride is liquid-treated, that is, wet-treated to form an insulating film IFE having a thickness THIE on the charge storage film EC1. The water-containing treatment liquid used is a treatment liquid for forming an oxide film. When pure water is used as the treatment liquid, the temperature of the treatment liquid supplied to the upper surface PS of the semiconductor substrate SB can be set at room temperature, that is, 23° C. or more but not more than 100° C. With regard to the definition of pure water, pure water has a specific resistance at room temperature of preferably 10 MΩcm or more, more preferably 18 MΩcm or more.

The insulating film IFE formed by such liquid treatment has a thickness THIE of at least one atomic layer or more or greater than 0.1 nm. The thickness THIE of the insulating film IFE is smaller than the thickness THE1 of the charge storage film EC1. This facilitates injection of electrons or holes into the charge storage film EC2 (refer to FIG. 14) from the semiconductor substrate SB and at the same time, makes it possible to prevent the injected electrons or holes from escaping from the charge storage film EC2 to the semiconductor substrate SB.

The thickness THIE of the insulating film IFE is smaller than the thickness TH1 of the insulating film IF1. The thickness of the insulating film IF1 as a bottom oxide film can thus be secured.

In such a manner, the ultra-thin insulating film IFE can be formed in short time and with good film-thickness controllability by the above-described liquid treatment.

After supply of the treatment liquid is stopped, drying treatment is performed by rotating the semiconductor substrate SB and shaking off the liquid from it, for example, for about 20 seconds. Then, the rotation of the semiconductor substrate SB is stopped and the semiconductor substrate SB is removed from the wafer stage.

By the liquid treatment of the semiconductor substrate SB with the treatment liquid, foreign matters attached to the upper surface of the charge storage film EC1 can be removed and thereby the upper surface of the charge storage film EC1 can be made smooth. The MONOS transistor thus obtained can therefore have improved reliability.

As the treatment liquid for forming an oxide film, various water-containing treatment liquids such as treatment liquids containing ozone ($O_3$) water or hydrogen peroxide ($H_2O_2$) water can be used as will be described later in Second Embodiment. Alternatively, a step of subjecting the semiconductor substrate SB to liquid treatment, that is, wet treatment with such a treatment liquid for forming an oxide film and a step of subjecting the semiconductor substrate SB to liquid treatment, that is, wet treatment with a treatment liquid for removing the oxide film such as a hydrofluoric acid-containing treatment liquid can be repeated alternately.

In the above-mentioned example, a method of liquid-treating a semiconductor substrate one by one by using a single-wafer type liquid treatment apparatus has been described. Instead of the single-wafer type liquid treatment apparatus, a batch type liquid treatment apparatus may be used for simultaneous liquid treatment, that is, simultaneous wet treatment of a plurality of semiconductor substrates.

In the technology disclosed in Patent Document 2 or Patent Document 3, a natural oxide film is formed on the surface of the semiconductor substrate and the polycrystalline silicon film formed on the semiconductor substrate during washing the semiconductor substrate with water. Neither Patent Document 2 nor Patent Document 3 however describes formation of an insulating film containing silicon and oxygen on an insulating film containing silicon and nitrogen during washing of the semiconductor substrate with water.

Figure 14:
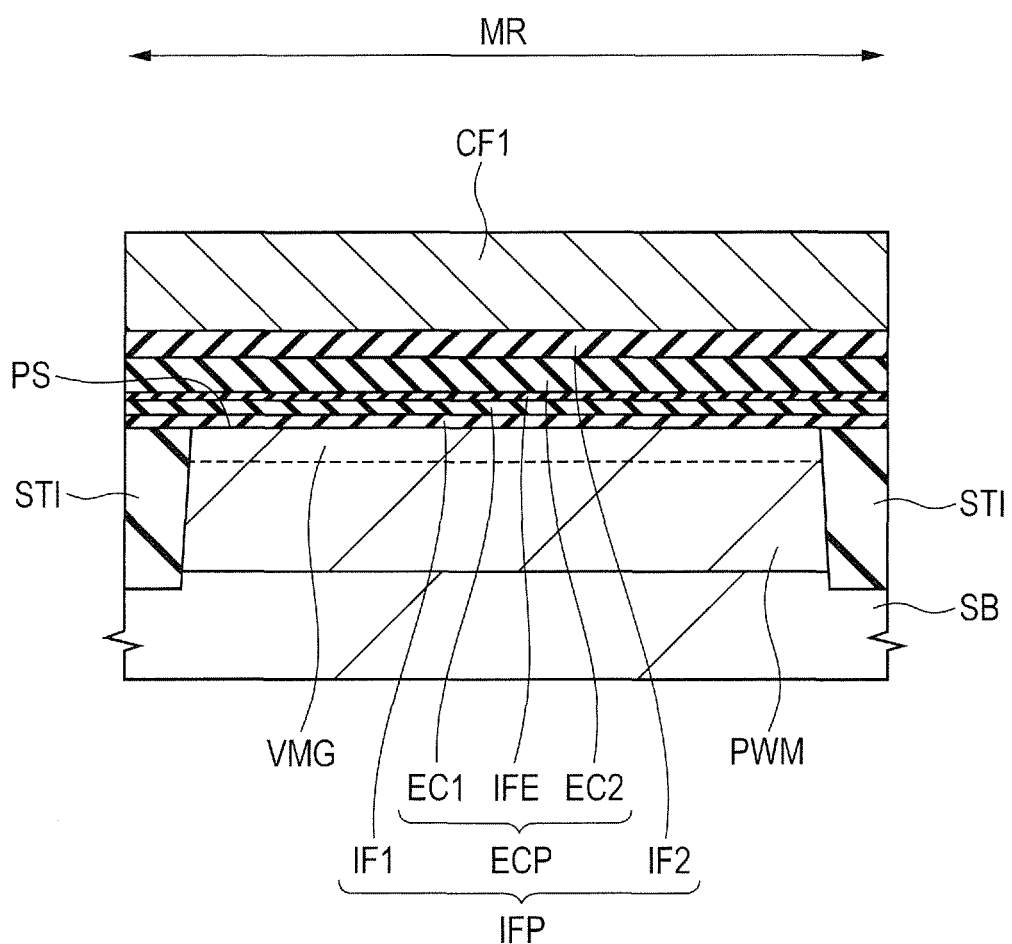
FIG. 14 is a fragmentary cross-sectional view of the semiconductor device of First Embodiment during a manufacturing step thereof.
Figure 15:
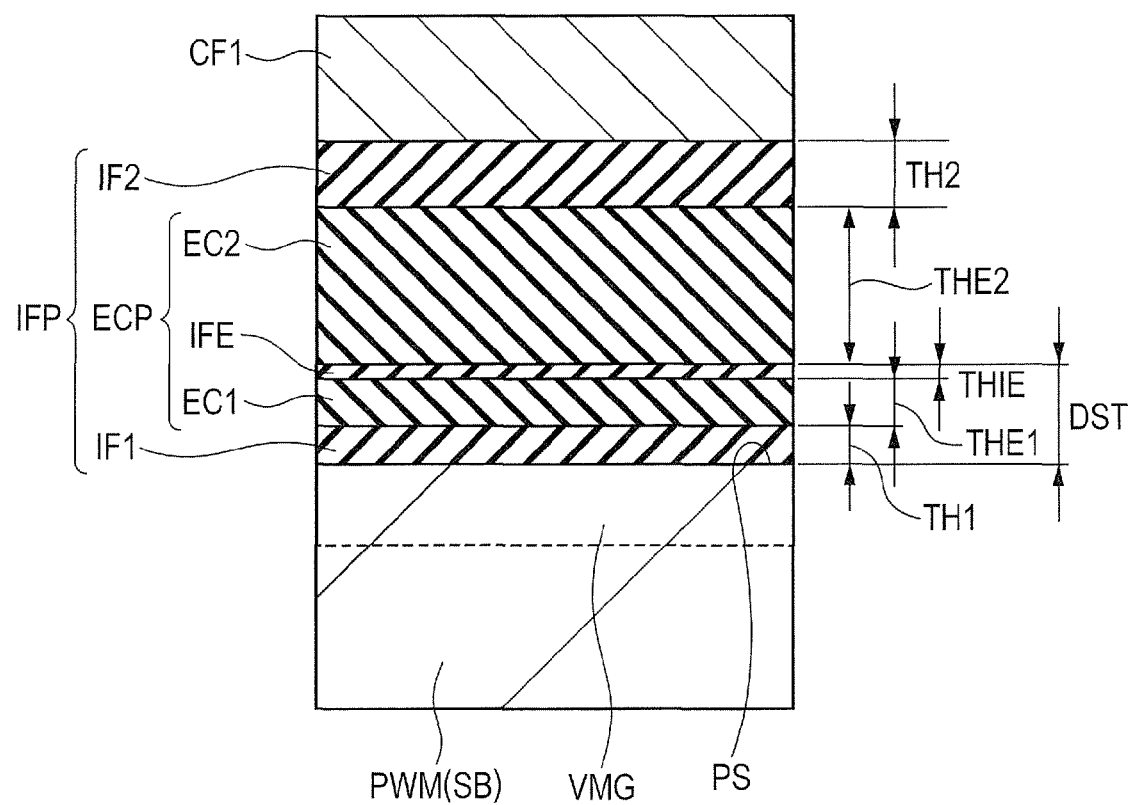
FIG. 15 is a fragmentary cross-sectional view of the semiconductor device of First Embodiment during a manufacturing step thereof.

Next, as shown in FIGS. 14 and 15, the charge storage film EC2 is formed (Step S24 of FIG. 7). In this Step S24, the charge storage film EC2 is formed on the insulating film IFE in the memory formation region MR.

The charge storage film EC2 is an insulating film containing silicon and nitrogen and is made of, for example, silicon nitride. The charge storage film EC2 can be formed, for example, by CVD, preferably by LPCVD using, for example, a dichlorosilane ($SiH_2Cl_2$) gas and an ammonia ($NH_3$) gas as a raw material gas. Alternatively, the charge storage film EC2 can be formed by LPCVD using, for example, a silane ($SiH_4$) gas and an ammonia gas as a raw material gas. The charge storage film EC2 has a thickness THE2 of, for example, about 9 nm.

Next, as shown in FIGS. 14 and 15, the insulating film IF2 is formed (Step S25 of FIG. 7). In this Step S25, the insulating film IF2 is formed on the charge storage film EC2 in the memory formation region MR.

The insulating film IF2 is an insulating film containing silicon and oxygen and is made of, for example, silicon oxide. The insulating film IF2 can be formed preferably by thermal oxidation such as wet oxidation or ISSG oxidation. Wet oxidation is a method of carrying out heat treatment in a gas obtained by adding deionized water vapor to an oxygen gas. The insulating film IF1 can also be formed preferably by HTO (high temperature oxide). By this method, the insulating film IF2 which is made of silicon oxide, is densified, and has a good film quality can be formed. The insulating film IF2 has a thickness TH2 of, for example, about 3 nm.

In such a manner, the insulating film portion IFP including the insulating film IF1, the charge storage film EC1, the insulating film IFE, the charge storage film EC2, and the insulating film IF2 can be formed on the upper surface PS of the semiconductor substrate SB. The charge storage film EC1, the insulating film IFE, and the charge storage film EC2 configure the charge storage portion ECP.

As described above, the insulating film IFE is provided mainly for the purpose of keeping an adequate distance, as the distance DST, from the upper surface PS of the semiconductor substrate SB to the lower surface of the charge storage film EC2 and thereby improving data retention properties. At the same time, the thickness THE2 of the charge storage film EC2 can be made greater than the thickness THE1 of the charge storage film EC1 and thus, the thickness THE1 of the charge storage film EC1 can be made relatively small. This makes it possible to improve an efficiency of injecting holes from the p well PWM of the semiconductor substrate SB to the charge storage film EC2 during erasing data.

By providing the insulating film IFE and thereby decreasing the thickness THE1 of the charge storage film EC1, the distance DST from the upper surface PS of the semiconductor substrate SB to the lower surface of the charge storage film EC2 can be adjusted to an adequate distance which allows improving of an electron or hole injection efficiency while improving data retention properties.

As will be described later referring to FIGS. 21 to 28, the distance DST, that is, a total of the thickness TH1 of the insulating film IF1, the thickness THE1 of the charge storage film EC1, and the thickness THIE of the insulating film IFE can be increased to, for example, about 4 nm. Electrons do not easily tunnel from the charge storage film EC2 to the semiconductor substrate SB in a write state, that is, during retention time after electron injection, leading to improvement in data retention properties.

When figures are each rounded to the first decimal place and, for example, the thickness TH1 of the insulating film IF1, the thickness THIE of the charge storage film EC1, and the thickness THIE of the the insulating film IFE are set at 2.0 nm, 2.0 nm, and 0.2 nm, respectively, the distance DST, that is, a total of the thickness TH1 of the insulating film IF1, the thickness THE1 of the charge storage film EC1, and the thickness THIE of the insulating film IFE can be set at 4.2 nm or more. As described above, therefore, electrons do not easily tunnel from the charge storage film EC2 to the semiconductor substrate SB in a write state, that is, during data retention time after electron injection, leading to improvement in data retention properties.

The thickness THIE of the insulating film IFE is smaller than the thickness THE1 of the charge storage film EC1. The thickness THIE of the insulating film IFE can therefore be made relatively small. This enables electrons or holes to be injected easily from the semiconductor substrate SB to the charge storage film EC2 while being tunneled through the insulating film IF1, the charge storage film EC1, and the insulating film IFE.

The thickness THIE of the insulating film IFE is smaller than the thickness TH1 of the insulating film IF1. The insulating film IF1 can therefore ensure the thickness as a bottom oxide film.

Next, as shown in FIGS. 14 and 15, the conductive film CF1 is formed (Step S5 in FIG. 6). In this Step S5, the conductive film CF1 for gate electrode is formed on the insulating film portion IFP in the memory formation region MR.

The conductive film CF1 is made of, preferably a polycrystalline silicon film, that is, a polysilicon film. Such a conductive film CF1 can be formed by CVD or the like. The conductive film CF1 can be thick enough to cover therewith the insulting film portion IFP. At the time of forming the conductive film CF1, the conductive film CF1 can also be obtained by forming an amorphous silicon film and then, heat treating the resulting amorphous silicon film into a polycrystalline silicon film.

As the conductive film CF1, that obtained by introducing an n type impurity, for example, phosphorus (P) or arsenic (As) to reduce the resistivity thereof is preferred.

The impurity can be introduced during or after the formation of the conductive film CF1. When the impurity is introduced during formation of the conductive film CF1, the conductive film CF1 having the impurity introduced therein can be formed by incorporating a doping gas in a film forming gas for the conductive film CF1.

When the impurity is introduced after the silicon film is formed, the silicon film is formed without intentionally introducing the impurity therein and then, the impurity is introduced into this silicon film by ion implantation or the like to form the conductive film CF1 having the impurity introduced therein.

For the formation of a p channel type MONOS transistor, a conductive film having a p type impurity such as boron (B) introduced therein to have a low resistivity is preferably used.

Figure 16:
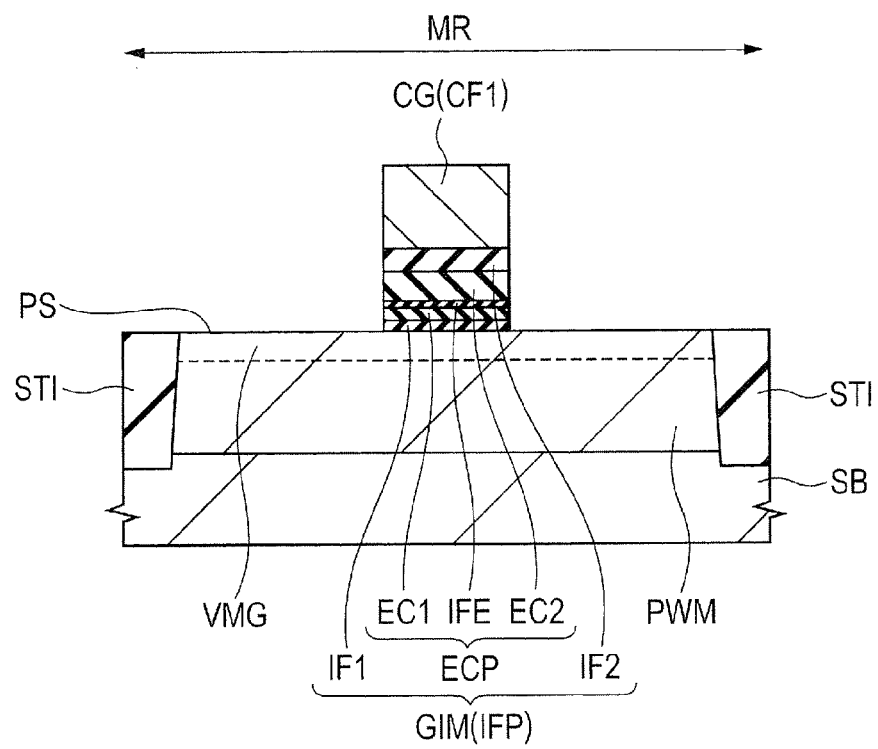
FIG. 16 is a fragmentary cross-sectional view of the semiconductor device of First Embodiment during a manufacturing step thereof.
Figure 17:
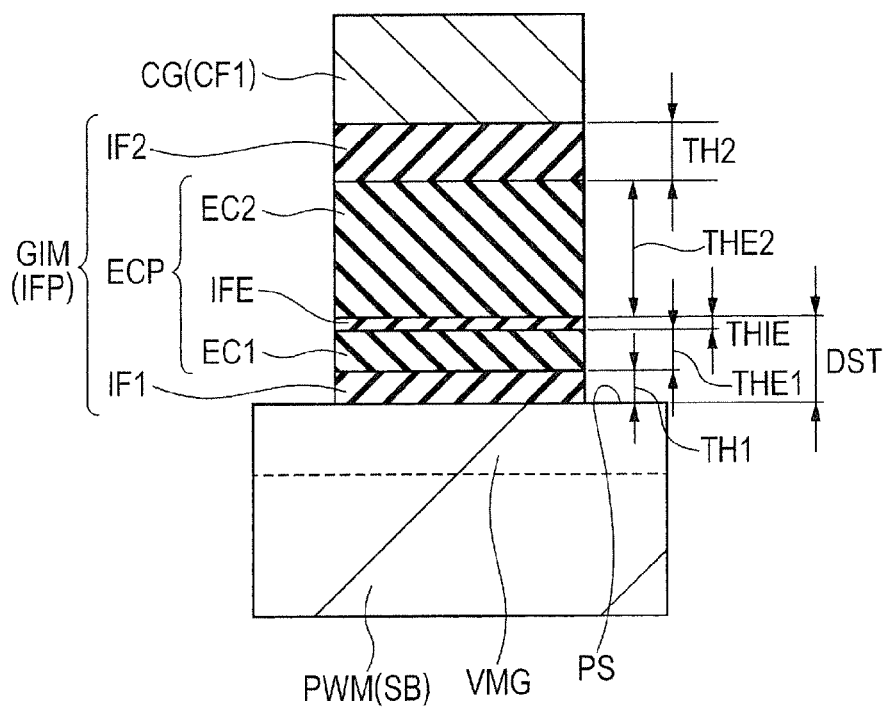
FIG. 17 is a fragmentary cross-sectional view of the semiconductor device of First Embodiment during a manufacturing step thereof.

Next, as shown in FIGS. 16 and 17, the conductive film CF1 and the insulating film portion IFP are patterned in the memory formation region MR (Step S6 in FIG. 6).

In this Step S6, a resist film (not shown) is formed on the upper surface PS of the semiconductor substrate SB by application, followed by patterning of the resist film by photolithography. The rest film is patterned so as to cover, with the resist film, a portion of the conductive film CF1 placed in a formation region of the gate electrode CG in the memory formation region MR and to expose, from the resist film, a portion of the conductive film CF1 placed in the memory formation region MR but other than the formation region of the gate electrode CG.

In this Step S6, as shown in FIGS. 16 and 17, the conductive film CF1 and the insulating film portion IFP are patterned by etching, for example, dry etching with the patterned resist film (not shown) as a mask. Alternatively, after patterning the conductive film CF1 by etching, more specifically, dry etching, the insulating film portion IFP may be patterned by etching, more specifically, wet etching.

By this patterning, in the memory formation region MR, a gate electrode CG made of the conductive film CF1 is formed and a gate insulating film GIM made of a portion of the insulating film portion IFP between the gate electrode CG and the p well PWM of the semiconductor substrate SB is formed. This means that in the memory formation region MR, the gate electrode CG is formed on the p well PWM of the semiconductor substrate SB via the gate insulating film GIM. Then, the patterned resist film (not shown) is removed, for example, by asking.

Figure 18:
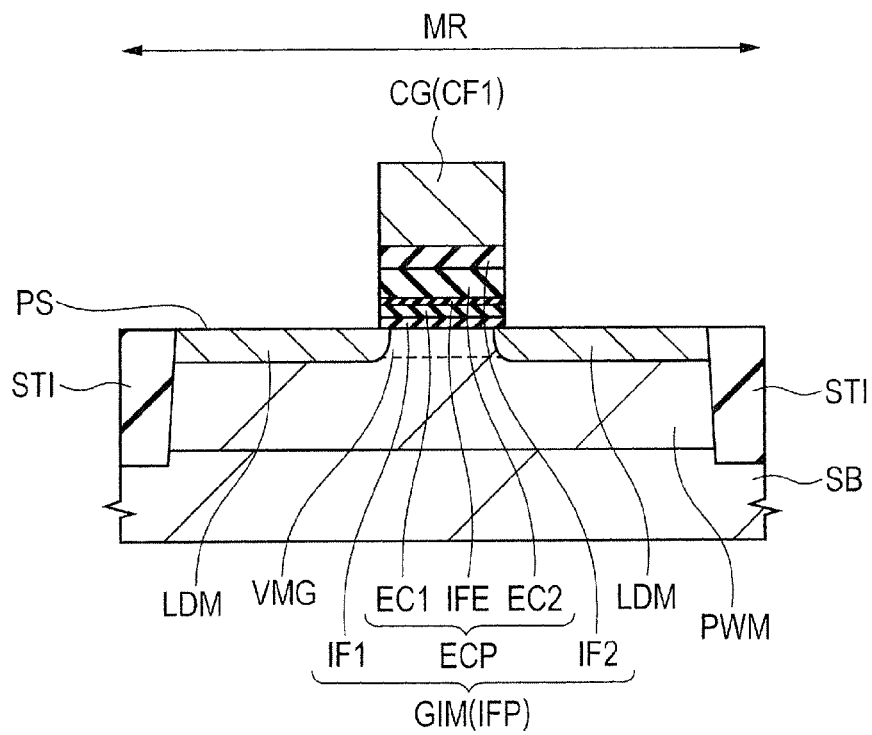
FIG. 18 is a fragmentary cross-sectional view of the semiconductor device of First Embodiment during a manufacturing step thereof.
Figure 28:
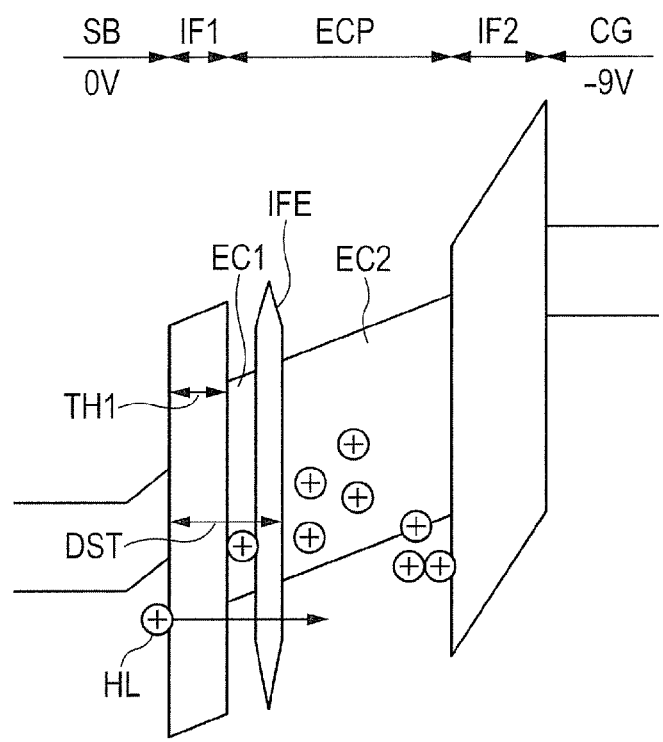
FIG. 28 is a band diagram showing energy distribution of the semiconductor device of First Embodiment at an erase time.

Next, as shown in FIG. 18, n⁻ type semiconductor regions LDM are formed (Step S7 in FIG. 6). In this Step S7, as shown in FIG. 28, an n type impurity such as arsenic (As) or phosphorus (P) is introduced into the semiconductor substrate SB by ion implantation, while using the gate electrode CG as a mask. Thus, in the memory formation region MR, the n⁻ type semiconductor regions LDM are formed in the upper layer portion of the p well PWM located, in plan view, on both sides having the gate electrode CG therebetween, respectively. The n⁻ type semiconductor regions LDM are formed in alignment with side surfaces of the gate electrode CG, respectively.

When the p channel type MONOS transistor is formed, on the other hand, a p type impurity such as boron (B) is introduced into the semiconductor substrate SB by ion implantation in the memory formation region MR while using the gate electrode CG as a mask.

Figure 19:
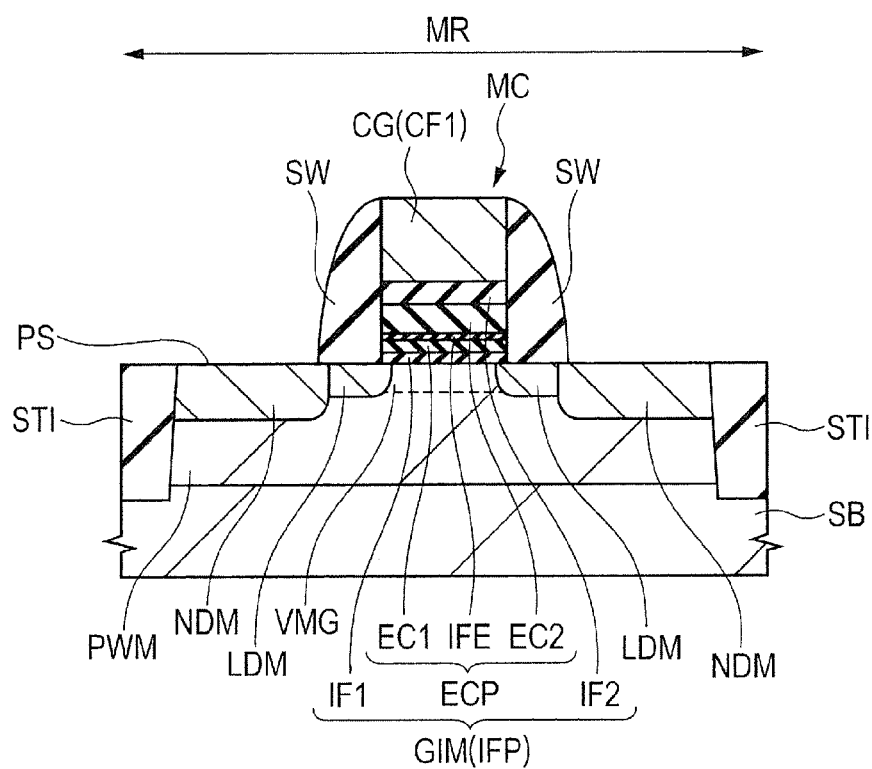
FIG. 19 is a fragmentary cross-sectional view of the semiconductor device of First Embodiment during a manufacturing step thereof.

Next, as shown in FIG. 19, sidewall spacers SW are formed (Step S8 in FIG. 6).

In this Step S8, an insulating film for sidewall spacer is formed on the entirety of the upper surface PS of the semiconductor substrate SB. The insulating film is, for example, an insulating film made of silicon oxide or an insulating film made of silicon nitride, or a stacked film of them. In the memory formation region MR, the insulating film lies on the upper surface of the n⁻ type semiconductor region LDM, the side surfaces of the gate insulating film GIM, and the side surfaces and the upper surface of the gate electrode CG.

In this Step S8, as shown in FIG. 19, the insulating film is then etched back, for example, by anisotropic etching to selectively leave the insulating film on the side surfaces of the gate electrode CG in the memory formation region MR to form sidewall spacers SW made of the insulating film on the side surfaces of the gate electrode CG, respectively. By the resulting sidewall spacers, the $n^+$ type semiconductor regions NDM to be formed later in Step S9 are electrically isolated from the gate electrode CG.

Next, as shown in FIG. 19, $n^+$ type semiconductor regions NDM are formed (Step S9 of FIG. 6). In this Step S9, in the memory formation region MR, an n type impurity such as arsenic (As) or phosphorus (P) is introduced into the semiconductor substrate SB by ion implantation while using the gate electrode CG and the sidewall spacer SW as a mask. Thus, in the memory formation region, the $n^+$ type semiconductor regions NDM are formed in an upper layer portion of the p type well PWM located, in plan view, on the sides opposite to the gate electrode CG, while having the sidewall spacers SW between them. The $n^+$ type semiconductor regions NDM are formed in alignment with the sidewall spacers SW, respectively, in the memory formation region MR.

As a result, as shown in FIG. 19, the MONOS transistor MC is formed, in the memory formation region MR, from the p well PWM, the p type semiconductor region VMG, the gate insulating film GIM, the gate electrode CG, the sidewall spacers SW, the $n^-$ type semiconductor regions LDM, and the $n^+$ type semiconductor regions NDM. From the MONOS transistor MC, a memory cell of a nonvolatile memory is formed.

When a p channel type MONOS transistor is formed, a p type impurity such as boron (B) is introduced into the semiconductor substrate SB in the memory formation region MR by ion implantation, with the gate electrode CG and the sidewall spacers SW as a mask.

Next, as shown in FIG. 3, the silicide film CS, the insulating film SNF, the interlayer insulating film IL1, and the plug PG are formed (Step S10 in FIG. 6).

In this Step S10, first, as shown in FIG. 3, the silicide film CS is formed. Described specifically, a metal film is formed on the entirety of the upper surface PS of the semiconductor substrate SB so as to cover therewith the $n^+$ type semiconductor regions NDM, the gate electrode CG, and the sidewall spacers SW. The metal film is made of, for example, a cobalt (Co) film, a nickel (Ni) film, or a nickel platinum alloy film and can be formed using sputtering or the like. The resulting semiconductor substrate SB is then heat treated to cause reaction between the upper layer portion of each of the $n^+$ type semiconductor regions NDM and the gate electrode CG and the metal film. Then, an unreacted portion of the metal film is removed.

Such a so-called salicide process is performed to form the silicide film CS on each of the $n^+$ type semiconductor regions NDM and the gate electrode CG as shown in FIG. 3. The silicide film CS can be provided, for example, as a cobalt silicide layer, a nickel silicide layer, or a platinum-added nickel silicide layer.

In this Step S10, as shown in FIG. 3, the insulating film SNF is thereafter formed. Described specifically, the insulating film SNF is formed on the entirety of the upper surface PS of the semiconductor substrate SB so as to cover the $n^+$ type semiconductor regions NDM, the gate electrode CG, and the sidewall spacers SW. The insulating film SNF is made of, for example, silicon nitride. The insulating film SNF can be formed, for example, by CVD.

In this Step S10, as shown in FIG. 3, the interlayer insulating film IL1 is then formed on the insulating film SNF. The interlayer insulating film IL1 is, for example, an insulating film made of silicon oxide or a stacked film of an insulating film made of silicon nitride and an insulating film made of silicon oxide. After formation of the interlayer insulating film IL1, for example, by CVD, the upper surface of the interlayer insulating film IL1 is planarized.

In this Step S10, as shown in FIG. 3, a plug PG penetrating through the interlayer insulating film IL1 is then formed. First, with a resist pattern (not shown) formed on the interlayer insulating film IL1 formed by photolithography as an etching mask, the interlayer insulating film IL1 is dry etched to form a contact hole CNT in the interlayer insulating film IL1. Next, a conductive plug PG made of tungsten (W) or the like is formed, for example, as a conductor portion in the contact hole CNT.

The plug PG is formed, for example, by forming a barrier conductor film made of, for example, a titanium (Ti) film or a titanium nitride (TiN) film, or a stacked film of them on the interlayer insulating film IL1 including the inside of the contact hole CNT; forming a main conductor film made of, for example, a tungsten (W) film on the barrier conductor film so as to fill the contact hole CNT; and then removing an unnecessary portion of the main conductor film and the barrier conductor film on the interlayer insulating film IL1 by CMP, etch back, or the like method. The plug PG can be formed in such a manner. To simplify the drawing, FIG. 3 shows the barrier conductor film and the main conductor film configuring the plug PG as one film.

The contact hole CNT and the plug PG buried therein are formed on the $n^+$ type semiconductor region NDM. Although not shown, they are also formed on the gate electrode CG. From the bottom portion of the contact hole CNT, for example, a portion of the silicide film CS on the $n^+$ type semiconductor region NDM is exposed. Although not shown, a portion of the silicide film CS on the gate electrode CG is also exposed from the bottom of the contact hole.

Next, as shown in FIG. 3, the interlayer insulating film IL2 and the wiring ML1 are formed (Step S11 in FIG. 6).

In this Step S11, first, as shown in FIG. 3, the interlayer insulating film IL2 made of, for example, silicon oxide is formed on the interlayer insulating film IL1 having therein the plug PG. Then, a wiring trench is formed in the interlayer insulating film IL2 by photolithography and etching. Then, a copper (Cu) film is formed on the interlayer insulating film IL2 including the inside of the wiring trench. The copper film exposed on the interlayer insulating film IL2 except for the inside of the wiring trench is removed, for example, by polishing by CMP to leave the copper film only in the wiring trench formed in the interlayer insulating film IL2. Thus, the wiring ML1 can be formed. As a result, the semiconductor device of First Embodiment can be formed.

In First Embodiment, an example of forming the wiring ML1 made of a copper film has been described, but the wiring ML1 may be formed, for example, from an aluminum (Al) film.

In the manufacturing method of the semiconductor device of First Embodiment, the insulating film IFE is formed by liquid treatment with a treatment liquid, that is, wet treatment. Compared with the formation of the insulating film IFE, for example, by thermal oxidation or CVD, the thickness of the insulating film IFE can be made greater than the thickness of a single atomic layer and at the same time, can be made smaller than the upper thickness limit at which electrons or holes can cross the insulating film IFE and be injected, for example, by the Fowler-Nordheim (FN) phenomenon. As will be described later referring to FIGS. 21 to 30, an absolute value of a write/erase voltage, that is, a write voltage or an erase voltage can be reduced and at the same time, data retention properties can be improved.

The manufacturing method of the semiconductor device of First Embodiment has also the following advantages.

For example, it may be possible to form the charge storage film EC1 by ALD in the film formation chamber provided in the film forming apparatus in Step S22 and then, leaving the resulting semiconductor substrate SB in the air inside the film forming apparatus and at the same time, inside or outside the film forming chamber, thereby forming the insulating film IFE as a natural oxide film on the charge storage film EC1 in Step S23. In such a method, however, formation of a natural oxide film by leaving the semiconductor substrate in the air requires time, for example, as long as about 24 hours, leading to reduction in throughput, that is, reduction in the number of semiconductor substrates that can be treated per hour in the manufacturing steps of the semiconductor device.

In First Embodiment, on the other hand, when Step 23 is achieved, for example, by performing the liquid treatment using the above-mentioned single-wafer liquid treatment apparatus, the insulating film IFE can be formed on the charge storage film EC1 in about 50 seconds in total by carrying out the liquid treatment for about 30 seconds and then drying treatment for about 20 seconds. In short, in First Embodiment, by the above-mentioned liquid treatment, the ultra-thin insulating film IFE can be formed with good film-thickness controllability in a short time.

In First Embodiment, therefore, a drastic improvement in the throughput is achieved in the manufacturing steps of the semiconductor device. Further, the step of forming the insulating film IFE by the liquid treatment is a step completely similar to, for example, washing treatment with pure water. This process is a stable process already established as a manufacturing step of a semiconductor device so that improvement in yield can be expected.

In addition, according to First Embodiment, the ultra-thin insulating film IFE can be formed without decreasing the thickness THE1, for example, about 2 nm of the charge storage film EC1 made of, for example, silicon nitride. Since the insulating film IFE is formed by the liquid treatment with a treatment liquid, foreign matters attached to the upper surface of the charge storage film EC1 can be removed easily and the upper surface of the charge storage film IC1 can be made smooth easily. As a charge storage portion in the MONOS transistor, the charge storage portion ECP can have improved reliability.

The charge storage film EC1 formed, for example, by ALD at a temperature as low as less than 600° C. is likely to react with oxygen in the air and the surface condition of it changes only by leaving it in the air. In Step S23, therefore, the surface of the charge storage film EC1 can be stabilized by attaching oxygen to the surface of the charge storage film EC1.

According to First Embodiment, the insulating film IFE can be formed at a low temperature, for example, 23° C. or more but not more than 100° C. in Step S23 so that a thermal load applied to the main circuit can be reduced and the main circuit can therefore be influenced less.

As will be described later referring to FIGS. 21 to 30, First Embodiment can improve the reliability of a memory cell comprised of a MONOS transistor MC. Although semiconductor devices having a main circuit and, as an addition circuit, a nonvolatile memory have conventionally been used only for consumer products, for example, from the standpoint of required characteristics, the present embodiment makes it possible to use them also for large-power applications such as on-board applications and industrial applications.

As will be described later referring to FIGS. 29 to 30, in First embodiment, the absolute value of the write/erase voltage of the MONOS transistor can be made smaller than, for example, 10V. This makes it possible to mix-load a nonvolatile memory as a flash memory with a main circuit in a variety of cases, for example, ranging from a case where a base process of the main circuit is a so-called up-to-date process in which a line width of the main circuit is extremely narrow to a case where the base process is a conventional one in which the line width of the main circuit is not so narrow. More specifically, as will be described later referring to FIG. 31, a nonvolatile memory can be mix-loaded even when an I/O circuit having a breakdown voltage of 5V and a power supply voltage of 3.3V or an I/O circuit having a breakdown voltage of 4V and a power supply voltage of 2.5V is used.

In First Embodiment, addition of a photomask used for the formation of the insulating film IFE in the manufacturing step of the semiconductor device is not required. This makes it possible to mix-load a nonvolatile memory as a flash memory with a main circuit while suppressing an increase in manufacture load due to addition of a new step to the manufacturing steps of a semiconductor device as an existing product. In designing the semiconductor device of First Embodiment, property used for designing of a conventional semiconductor device can be diverted.

<Data Retention Properties>

Next, the data retention properties of the semiconductor device of First Embodiment will be described while comparing with those of a semiconductor device of Comparative Example 1.

Figure 20:
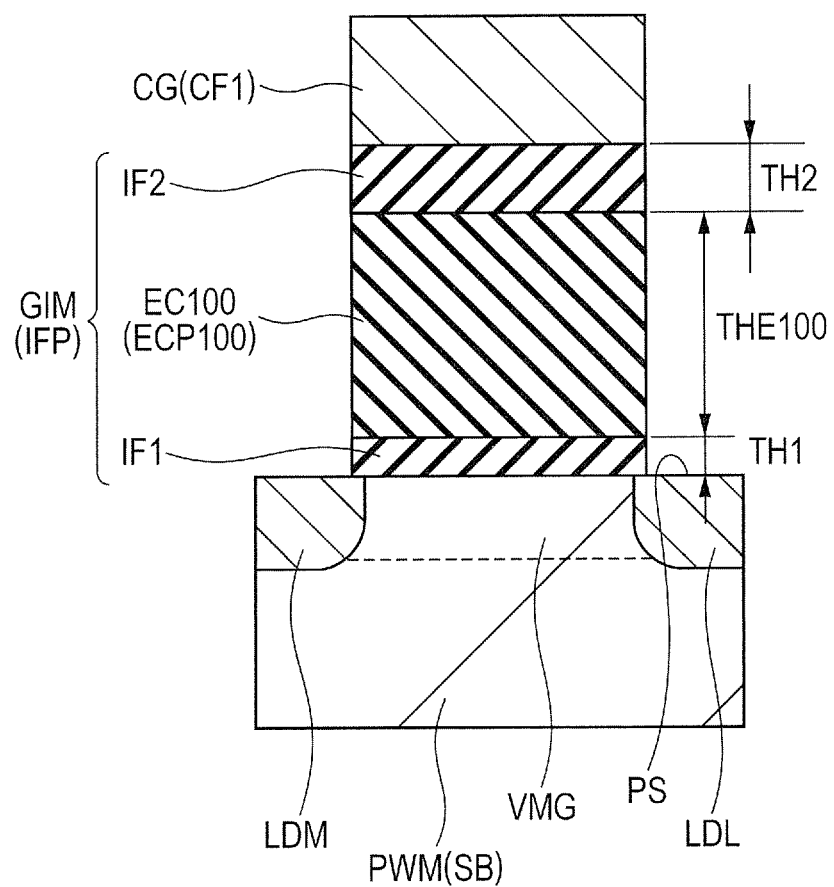
FIG. 20 is a fragmentary cross-sectional view of a semiconductor device of Comparative Example 1.

FIG. 20 is a fragmentary cross-sectional view of the semiconductor device of Comparative Example 1. FIG. 20 is a fragmentary cross-sectional view of the semiconductor device of Comparative Example 1 and is, at the same time, an enlarged cross-sectional view showing the gate insulating film GIM and therearound. It is a cross-sectional view corresponding to FIG. 4 which is an enlarged cross-sectional view.

Figure 21:
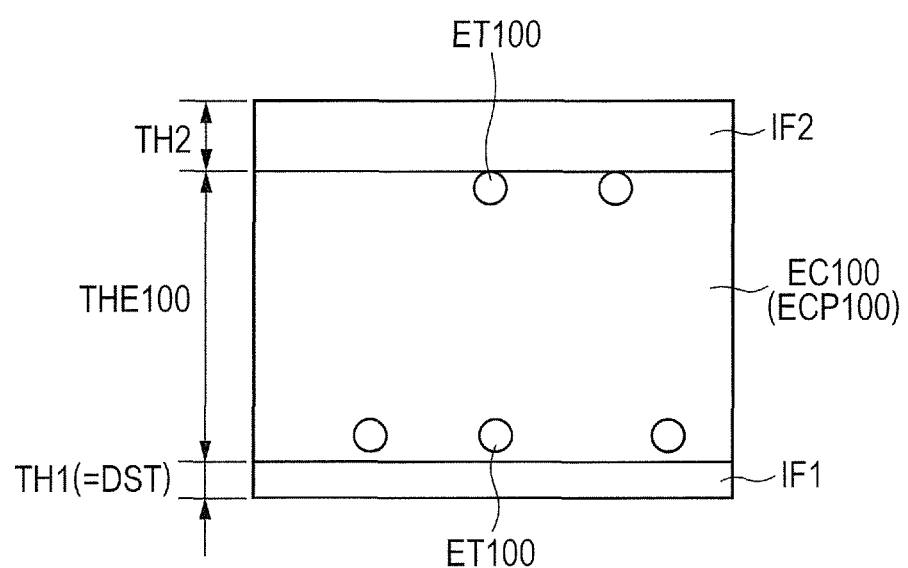
FIG. 21 is a cross-sectional view schematically showing the distribution of electron trap positions in a charge storage portion of the semiconductor device of Comparative Example 1.
Figure 22:
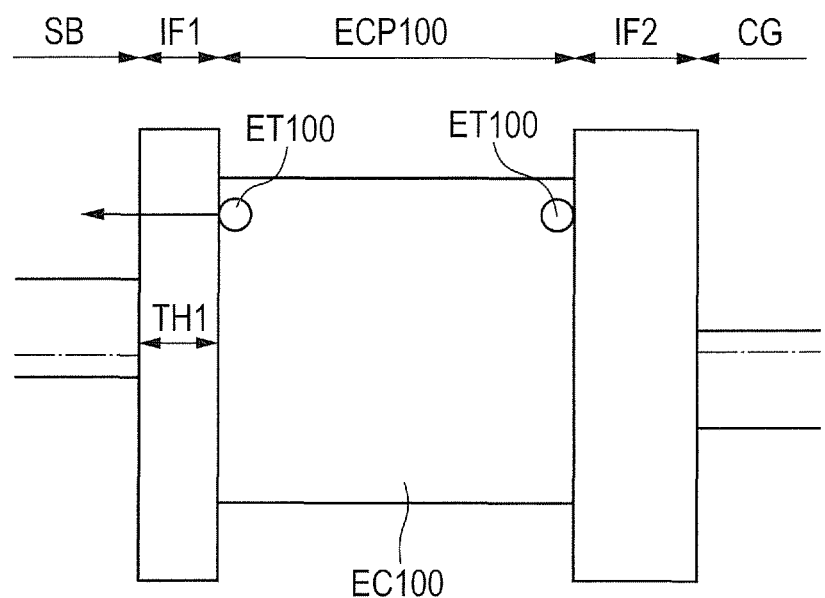
FIG. 22 is a band diagram showing energy distribution in write state of the semiconductor device of Comparative Example 1.
Figure 23:
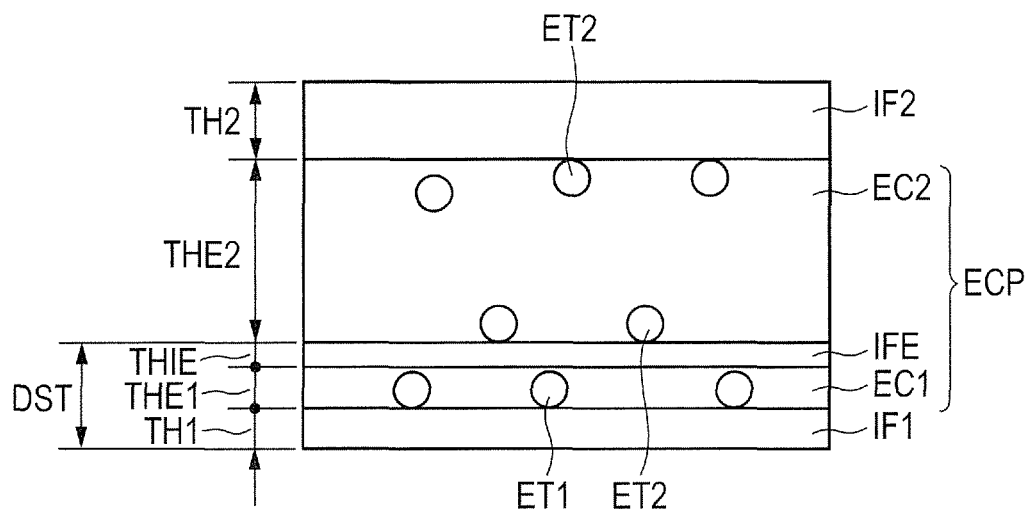
FIG. 23 is a cross-sectional view schematically showing the distribution of electron trap positions in a charge storage portion of the semiconductor device of First Embodiment.
Figure 24:
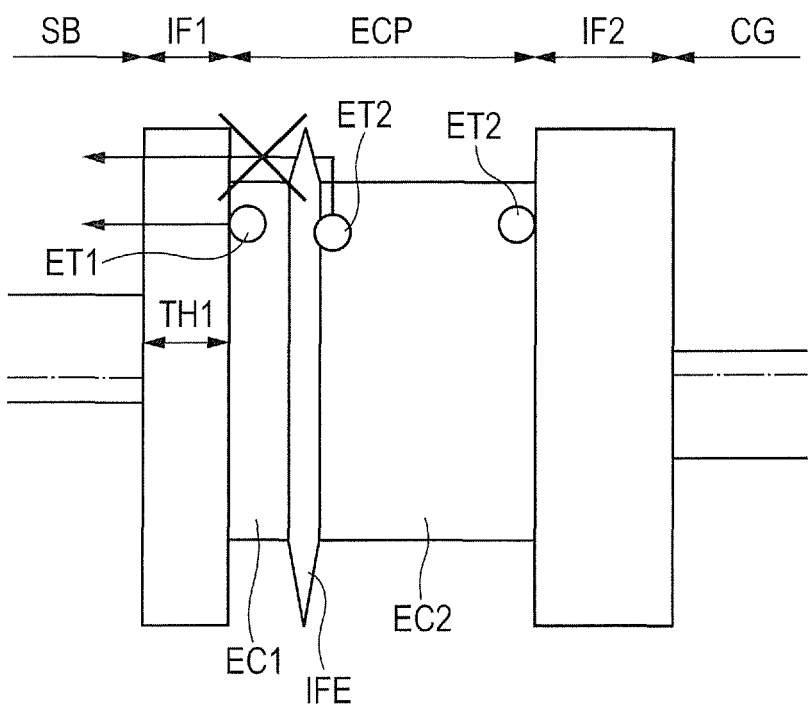
FIG. 24 is a band diagram showing energy distribution in write state of the semiconductor device of First Embodiment.

FIG. 21 is a cross-sectional view schematically showing the distribution of electron trap positions in a charge storage portion of the semiconductor device of Comparative Example 1. FIG. 22 is a band diagram showing energy distribution in write state of the semiconductor device of Comparative Example 1. FIG. 23 is a cross-sectional view schematically showing the distribution of electron trap positions in the charge storage portion of the semiconductor device of First Embodiment. FIG. 24 is a band diagram showing energy distribution in write state of the semiconductor device of First Embodiment.

In the semiconductor device of Comparative Example 1, the gate insulating film GIM includes an insulating film IF1 formed on the upper surface PS of a semiconductor substrate SB, a charge storage film EC100 as an insulating film formed on the insulating film IF1, and an insulating film IF2 formed on the charge storage film EC100. The charge storage film EC100 configures a charge storage portion ECP100. The insulating film IF1 is made of, for example, silicon oxide, the charge storage film EC100 is made of, for example, silicon nitride, and the insulating film IF2 is made of, for example, silicon oxide. The gate insulating film GIM therefore has a structure called "ONO (oxide-nitride-oxide) film".

The thickness TH1 of the insulating film IF1 as a bottom oxide film is set small to allow direct tunneling erase operation of holes from the semiconductor substrate SB to the charge storage film EC100 and it is, for example, about 2 nm. The thickness THE100 of the charge storage film EC100 as a portion of the charge storage portion ECP100 is, for example, 16 nm and the thickness THE2 of the insulating film IF2 as a top oxide film is, for example, about 3 nm.

In the semiconductor device of Comparative Example 1, the charge storage portion ECP100 is comprised of a single-layer of the charge storage film EC100. In such a case, the thickness TH1 of the insulating film IF1 is made as thin as about 2 nm to enable holes to directly tunnel the insulating film IF1 and perform erase operation, that is, to enable holes to perform direct tunneling erase operation. Such a decrease in the thickness TH1 however shortens the distance between an electron trap position ET100 formed in the vicinity of the interface between the insulating film IF1 and the charge storage film EC100 and the upper surface of the semiconductor substrate SB. Electrons are therefore likely to tunnel from the charge storage film EC100 to the semiconductor substrate SB in write state, that is, at the time of data retention after electron injection and data retention properties cannot be improved. This limits the application range of the semiconductor device of Comparative Example 1 to so-called consumer products which permit data retention term of 10 years and programming frequency of 100000 times at a service temperature of 85° C. Further, in the semiconductor device of Comparative Example 1, holes are likely to tunnel and escape from the charge storage film EC100 to the semiconductor substrate SB in erase state.

An increase in the thickness THE100 of the charge storage film EC100 to, for example, about 16 nm in order to improve the data retention properties inhibits so-called voltage scaling, more specifically, inhibits a decrease in the thickness of the gate insulating film GIM for reducing the absolute value of a write/erase voltage. For example, the semiconductor device of Comparative Example 1 requires a voltage of a large absolute value, about ±13V, as a write/erase voltage so that as will be described later referring to FIG. 31, using an I/O circuit having a breakdown voltage of 13.5V and a power supply voltage of 13.5V is necessary as the base process of the I/O circuit.

Thus, in the semiconductor device of Comparative Example 1, the voltage scaling of the charge storage film EC100 is inhibited so that it is difficult to decrease the absolute value of the write/erase voltage, reduce the cell size of the MONOS transistor, and reduce the area of the main circuit including the I/O circuit.

In the semiconductor device of First Embodiment, on the other hand, as shown in FIG. 24, the charge storage portion ECP has two layers of the charge storage films EC1 and EC2 and a single layer of the insulating film IFE placed therebetween. As shown in FIG. 24, the band gap of each of the insulating films IF1, IFE, and IF2 is larger than the band gap of each of the charge storage films EC1 and EC2 comprised of an insulating film. The charge storage film EC1 as an insulating film has, in the band gap thereof, electron trap positions ET1 comprised of an impurity level or the like, while the charge storage film EC2 as an insulating film has, in the band gap thereof, an electron trap position ET2 comprised of an impurity level or the like. The charge storage film EC1 can therefore store charges comprised of electrons in the electron trap positions ET1 formed in the charge storage film EC1 and the charge storage film EC2 can therefore store charges comprised of electrons in the electron trap positions ET2 formed in the charge storage film EC2.

Due to such a structure of First Embodiment, as well as the electron trap positions ET1 formed in the vicinity of the interface between the insulating film IF1 and the charge storage film EC1, new electron trap positions ET2 which are formed in the vicinity of the interface between the insulating film IFE and the charge storage film EC2 and useful for data retention properties can be secured. The electron trap positions are placed at a position, for example, about 2 nm apart from the upper surface of the semiconductor substrate SB in Comparative Example 1. The distance from the upper surface of the semiconductor substrate SB can be increased to, for example, about 4 nm in First Embodiment. Such an increased distance makes it difficult for electrons to tunnel from the charge storage film EC2 to the semiconductor substrate SB in a write state, that is, during data retention after electron injection, leading to improvement in data retention properties.

In First Embodiment, data are written in the nonvolatile memory comprised of the MONOS transistor MC when a voltage is applied to between the semiconductor substrate SB and the gate electrode CG and electrons are injected from the semiconductor substrate SB to the gate insulating film GIM. On the other hand, data are erased from the nonvolatile memory comprised of the MONOS transistor MC when a voltage is applied to between the semiconductor substrate SB and the gate electrode CG and holes are injected from the semiconductor substrate SB to the gate insulating film GIM.

<Data Erase Efficiency>

A data erase efficiency of the semiconductor device of First Embodiment will next be described, while comparing with the semiconductor device of Comparative Examples 1 to 3.

Figure 25:
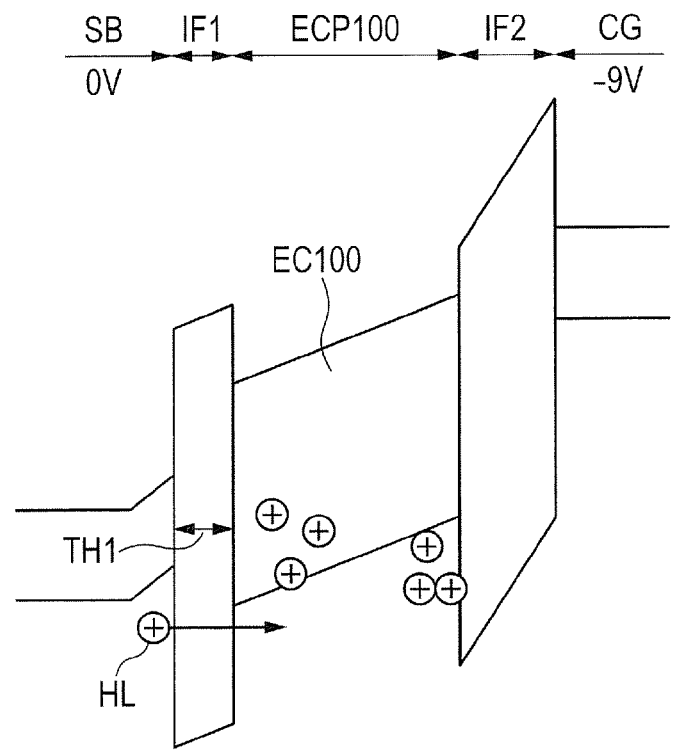
FIG. 25 is a band diagram showing energy distribution of the semiconductor device of Comparative Example 1 at an erase time.
Figure 26:
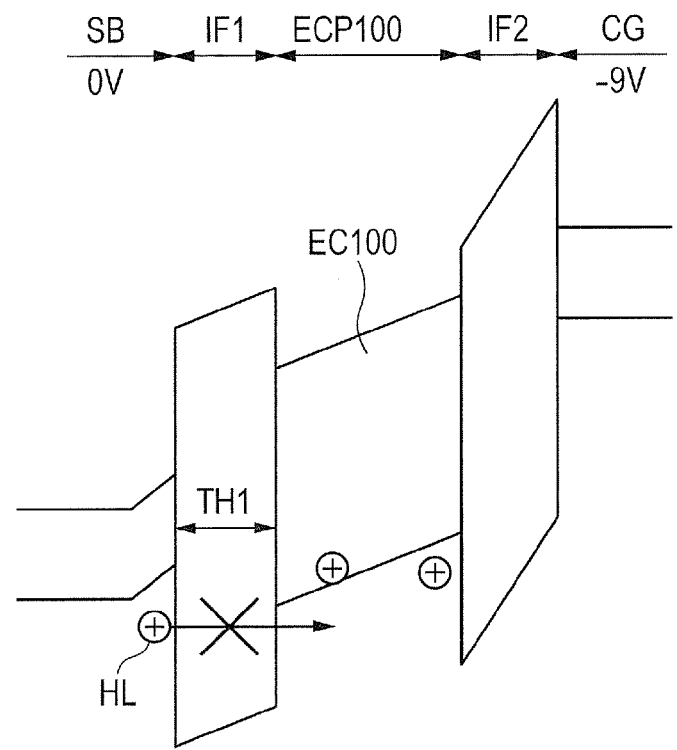
FIG. 26 is a band diagram showing energy distribution of a semiconductor device of Comparative Example 2 at an erase time.
Figure 27:
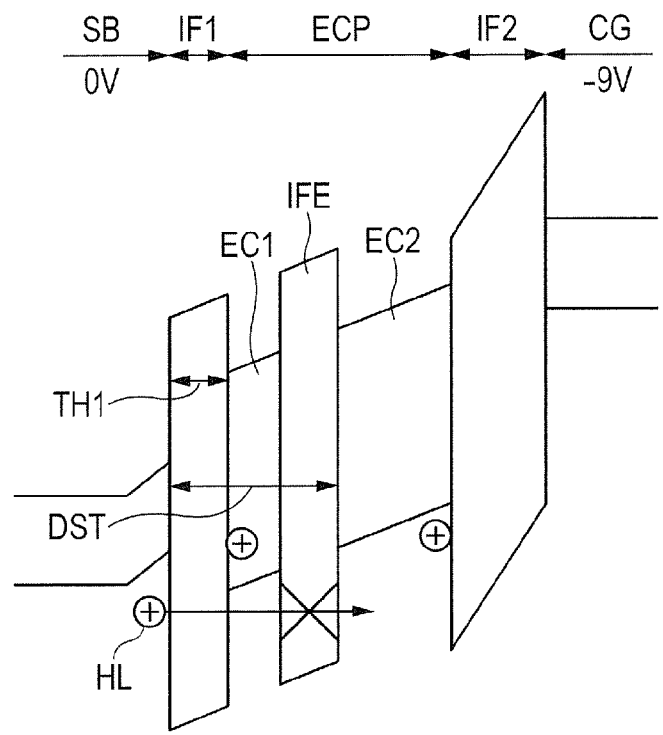
FIG. 27 is a band diagram showing energy distribution of a semiconductor device of Comparative Example 3 at an erase time.

FIG. 25 is a band diagram showing energy distribution of the semiconductor device of Comparative Example 1 at an erase time. FIG. 26 is a band diagram showing energy distribution of a semiconductor device of Comparative Example 2 at an erase time. FIG. 27 is a band diagram showing energy distribution of a semiconductor device of Comparative Example 3 at an erase time. FIG. 28 is a band diagram showing energy distribution of the semiconductor device of First Embodiment at an erase time.

As shown in FIG. 25, the charge storage portion ECP100 of the semiconductor device of Comparative Example 1 is comprised of a single layer of the charge storage film EC100. The thickness TH1 of the insulating film IF1 as a bottom oxide film is, for example, 2 nm and is relatively thin. Holes HL are therefore easily injected into the charge storage film EC100 from the channel region of the semiconductor substrate SB at an erase time and a hole injection efficiency, that is, an injection efficiency of the holes HL from the channel region of the semiconductor substrate SB to the charge storage film EC100 is high. In the semiconductor device of Comparative Example 1, data can be erased easily and a data erase efficiency, that is, an efficiency of erasing data is high.

As described above referring to FIG. 22, however, the semiconductor device of Comparative Example 1 is inferior in data retention properties, that is, retention properties.

As shown in FIG. 26, in the semiconductor device of Comparative Example 2, similar to the semiconductor device of Comparative Example 1, a charge storage portion ECP100 is comprised of a single layer of a charge storage film EC100, but the thickness TH1 of an insulating film IF1 as a bottom oxide film exceeds, for example, about 4 nm and is relatively thick. In such a case, the memory cell comprised of the MONOS transistor has deteriorated reliability because in spite of excellent data retention properties, a voltage of a large absolute value, for example, from ±13V to ±20V becomes necessary as a write/erase voltage.

Using, as a write/erase voltage, a voltage of a large absolute value increases a leakage current, for example, at the junction interface between a p type semiconductor region and an n type semiconductor region, that is, a leakage current at a pn junction. An increase in an array area of a memory cell comprised of a MONOS transistor becomes necessary for suppressing the leakage current so that a voltage of a large absolute value cannot be used as the write/erase voltage.

In addition, when a voltage of a large absolute value is used as the write/erase voltage, the I/O circuit included in the main circuit must have an increased breakdown voltage. It increases the area of the main circuit, making it impossible to improve the efficiency of the area of the semiconductor chip as a semiconductor device.

In short, the semiconductor device of Comparative Example 2 has excellent data retention properties, but has only a low hole injection efficiency because holes HL are not injected easily from the channel region to the charge storage film EC100 at an erase time. In the semiconductor device of Comparative Example 2, data cannot be erased easily and therefore, a data erase efficiency is low.

As shown in FIG. 27, a charge storage portion ECP of the semiconductor device of Comparative Example 3 is comprised of two layers of the charge storage films EC1 and EC2 and a single layer of the insulating film IFE placed therebetween. Different from First Embodiment, however, the thickness of the insulating film IFE is equal to or greater than the thickness of the charge storage film EC1. A distance DST, a total thickness of the insulating film IF1, the charge storage film EC1, and the insulating film IFE exceeds, for example, about 6 nm and is relatively thick. The semiconductor device of Comparative Example 3 has excellent data retention properties, but has only a low hole injection efficiency because holes HL are not injected easily from the channel region of the semiconductor substrate SB to the charge storage film EC2 at an erase time. In the semiconductor device of Comparative Example 3, data cannot be erased easily and therefore, a data erase efficiency is low.

As a measure for overcoming the above-mentioned problems in Comparative Examples 1 to 3, a structure capable of enhancing a hole injection efficiency by making use of direct tunneling (DT) through the insulating film IF1 and the insulating film IFE at an erase time can be considered. This is a structure of First Embodiment shown in the band diagram of FIG. 28. This structure can reduce the absolute value of the write/erase voltage because a voltage of ±12V is adequate as the write/erase voltage.

As shown in FIG. 28, in the semiconductor device of First Embodiment, the charge storage portion ECP is comprised of two layers of the charge storage films EC1 and EC2 and a single layer of the insulating film IFE placed therebetween. The distance DST which is a total thickness of the insulating film IF1, the charge storage film EC1, and the insulating film IFE is, for example, about 4 nm.

At the time of charge retention, the distance DST which is a total thickness of an apparent bottom oxide film, that is, the insulating film IF1, the charge storage film EC1, and the insulating film IFE can be increased to some extent and data retention properties can be increased.

First Embodiment provides a structure that at the time of charge retention, data retention properties are improved and at an erase time, more holes HL can be accumulated efficiently in the charge storage films EC1 and EC2 by making use of direct tunneling (DT) through the insulating film IF1 having the thickness TH1 of, for example, about 2 nm.

In the semiconductor device of First Embodiment, in addition to excellent data retention properties thereof, holes can be injected easily from the channel region of the semiconductor substrate SB to the charge storage film EC2 at an erase time and therefore a hole injection efficiency is high. Therefore, in the semiconductor device of First Embodiment, data can be erased easily and a data erase efficiency is high. In the semiconductor device of First Embodiment, therefore, an absolute value of an erase voltage can be decreased easily.

<Attenuation Ratio of Threshold Voltage>

Next, an attenuation ratio of the threshold voltage of the semiconductor device of First Embodiment will be described, while comparing with the semiconductor device of Comparative Example 1.

Figure 29:
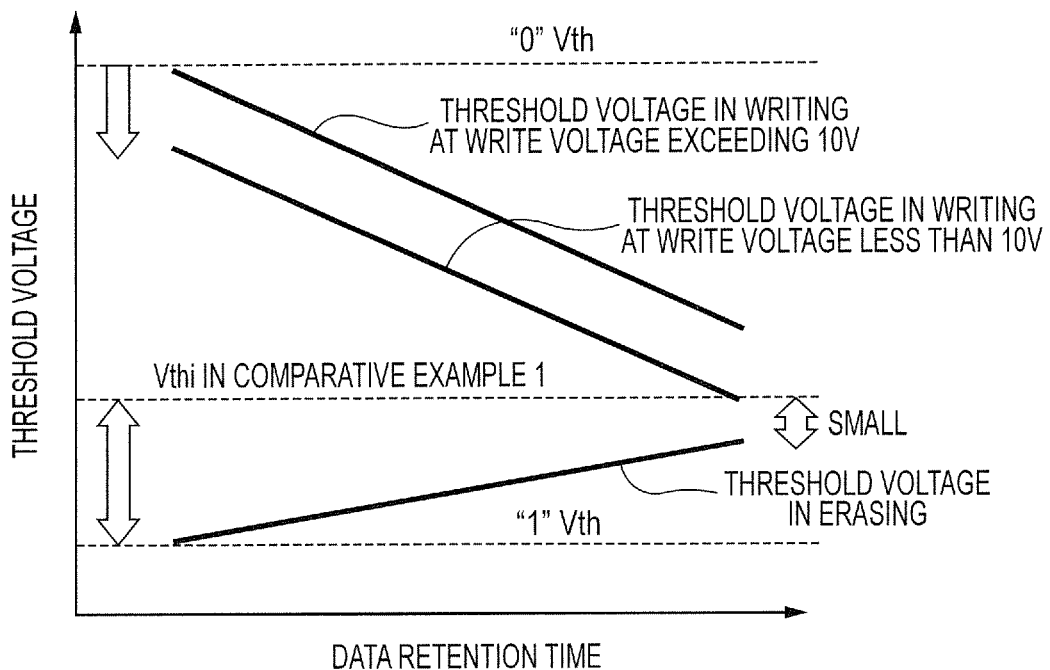
FIG. 29 is a graph for describing an attenuation ratio of a threshold voltage in the semiconductor device of Comparative Example 1.

FIG. 29 is a graph for describing an attenuation ratio of a threshold voltage in the semiconductor device of Comparative Example 1. FIG. 30 is a graph for describing an attenuation ratio of a threshold voltage in the semiconductor device of First Embodiment. Respective threshold voltages at a write time and an erase time are plotted along the ordinate in FIGS. 29 and 30 and data retention time is plotted along the abscissa in FIGS. 29 and 30.

Figure 30:
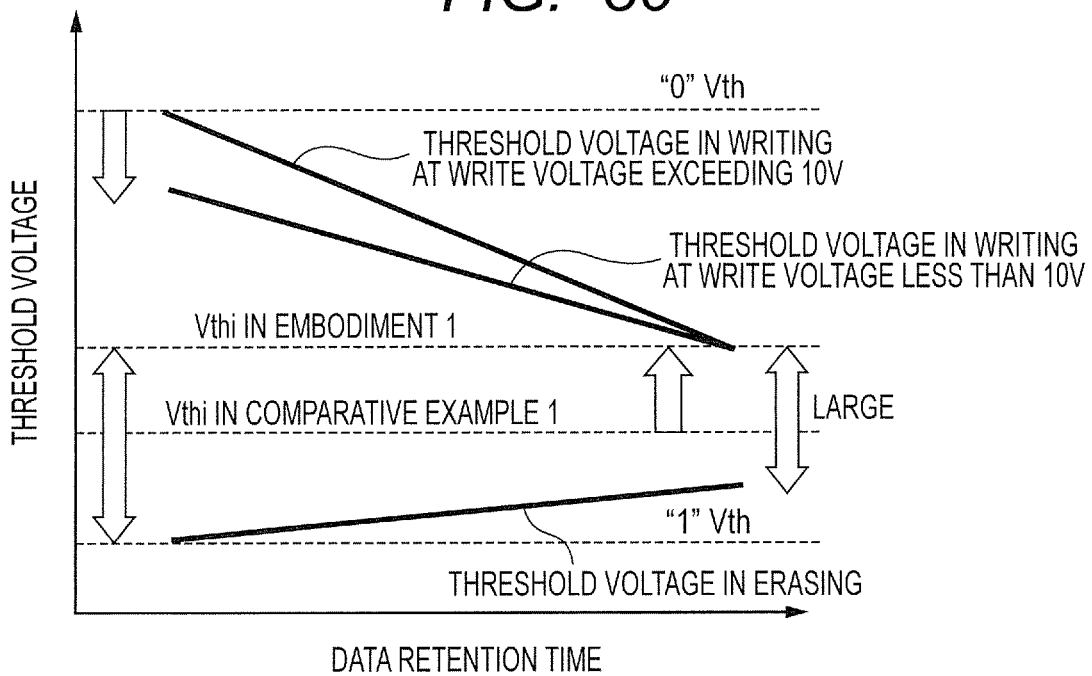
FIG. 30 is a graph for describing an attenuation ratio of a threshold voltage in the semiconductor device of First Embodiment.

In FIGS. 29 and 30, when a write voltage exceeds 10V, an initial threshold voltage in a write state in which data "0" is written in is indicated by "0"Vth and an initial threshold voltage at an erase time at which data "1" is written in is indicated by "1"Vth.

In the semiconductor device of Comparative Example 1, the charge storage portion ECP100 is comprised of a single layer of the charge storage film EC100 (refer to FIG. 21). In such a case, the thickness TH1 (refer to FIG. 22) of the insulating film IF1 is decreased to, for example, about 2 nm in order to allow direct tunneling erase operation, that is, direct tunneling of holes through the insulating film IF1 to perform erase operation. Such a decrease in the thickness TH1 however shortens the distance between the electron trap positions ET100 (refer to FIG. 22) formed in the vicinity of the interface between the insulating film IF1 and the charge storage film EC100 and the upper surface of the semiconductor substrate SB. Therefore, electrons are likely to tunnel from the charge storage film EC100 to the semiconductor substrate SB in write state, that is, at the time of data retention after electron injection. This limits the application range of the semiconductor device of Comparative Example 1 to so-called consumer products which permit data retention time of 10 years and programming frequency of 100000 times, for example, at a service temperature of 85° C.

In other words, in the semiconductor device of Comparative Example 1, in a write state in which electrons are injected into the charge storage film EC100 and data "0" is written in, electrons are injected easily into the charge storage film EC100, but electrons are likely to tunnel and escape from the charge storage film EC100 to the semiconductor substrate SB. At a write voltage less than 10V, compared with a write voltage exceeding 10V, therefore, not many electrons are injected into the charge storage film EC100 and electrons injected into the charge storage film EC100 escape to the semiconductor substrate SB with the passage of time.

After data retention time of 10 years for example, when a write voltage is less than 10V, a difference between the threshold voltage at an erase time at which data "0" is erased and becomes "1" due to injection of holes into the charge storage film EC100 and the threshold voltage in a write state becomes smaller compared with a write voltage exceeding 10V. In an erase state, holes are likely to tunnel and escape from the charge storage film EC100 to the semiconductor substrate SB.

In the semiconductor device of First Embodiment, on the other hand, the charge storage portion ECP100 is comprised of two layers of the charge storage films EC1 and EC2 and a single layer of the insulating film IFE placed therebetween. In First Embodiment, new electron trap positions ET2 (refer to FIG. 23) useful for data retention properties can be secured. Compared with Comparative Example 1, the electron trap positions can be kept away to a position distant by about 4 nm from the upper surface of the semiconductor substrate SB.

In the semiconductor device of First Embodiment, escape of electrons from the newly provided electron trap positions ET2 to the semiconductor substrate SB is not likely to occur. In First Embodiment, therefore, an attenuation ratio, that is, a ratio of a threshold voltage at a write time attenuating with the passage of data retention time decreases.

As shown in FIG. 30, an attenuation ratio of a threshold voltage at a write time when a write voltage is less than 10V is smaller than an attenuation ratio of a threshold voltage at a write time when a write voltage exceeds 10V. This means that in First Embodiment, different from Comparative Example 1, an effect of decreasing an attenuation ratio of a threshold voltage at a write time increases with a decrease in the absolute value of a write voltage.

Depending on the process conditions in the manufacturing step of the semiconductor device, a negative fixed charge is generated in the vicinity of the interface between the charge storage film EC2 and the insulating film IFE and an intrinsic threshold voltage Vthi may become a little higher. At this time, as shown in FIGS. 29 and 30, the threshold voltage Vthi of First Embodiment is higher than the threshold voltage Vthi of Comparative Example 1.

Further, in the semiconductor device of First Embodiment, escape of holes from the newly provided electron trap positions ET2 to the semiconductor substrate SB is not likely to occur. In First Embodiment compared with Comparative Example 1, therefore, a ratio at which a threshold voltage at an erase time is attenuated with the passage of a data retention time, that is, an attenuation ratio decreases.

In First Embodiment, for example, after data retention time of 10 years when the write voltage is less than 10V, a difference between a threshold voltage at an erase time at which holes are injected into the charge storage film EC2 and data "0" is erased to become "1" and a threshold voltage at a write time becomes greater than that in Comparative Example 1.

Further, in the semiconductor device of First Embodiment, during data erasure, direct tunneling of holes from the semiconductor substrate SB to the charge storage film EC2 can be performed easily. Holes can therefore be injected efficiently into the charge storage film EC2 and a larger number of holes can be stored.

Due to these effects, in First Embodiment compared with Comparative Example 1, the thickness of the charge storage portion ECP comprised mainly of the charge storage film EC2 can be made smaller than the thickness of the charge storage portion ECP100 in Comparative Example 1. Due to a scaling effect for decreasing the thickness of the charge storage portion ECP, the write voltage can be reduced to, for example, about 10V or less. In other words, First Embodiment enables MFN (modified Fowler-Nordheim) low voltage writing.

<Reduction in I/O Circuit Area>

Next, a reduction in I/O circuit area in the semiconductor device of First Embodiment will be described. Here, Investigation Examples 1 to 5 are shown to investigate, when a memory cell comprised of a MONOS transistor is used as an add-on circuit for a main circuit, the relationship among a write/erase voltage necessary for the MONOS transistor, a breakdown voltage corresponding to the write/erase voltage, and a base process of the main circuit to which the add-on circuit is added.

FIG. 31 shows a table for describing the relationship among write/erase voltage, breakdown voltage, and base process of main circuit. The term "base process of main circuit" means the base process of a high breakdown voltage MISFET included in the I/O circuit 6 (refer to FIG. 1) and the base process of this high breakdown voltage MISFET depends on a power supply voltage of the I/O circuit. In FIG. 31, for example, "13V-IO" means that the base process of the main circuit is a base process of a high breakdown voltage MISFET included in an I/O circuit having a power supply voltage of 13V.

In the semiconductor device of Comparative Example 1, since the charge storage portion ECP100 is comprised of a single layer of the charge storage film EC100, a voltage of ±13.5V, that is, a voltage of a relatively large absolute value, is required as the write/erase voltage of the MONOS transistor. In such a case, using an I/O circuit having a breakdown voltage of 13.5V and a power supply voltage of 13.5V as is indicated by "13V-IO" in Investigation Example 1 of FIG. 31 allows write/erase operation of the MONOS transistor. By improving the circuit design, even using an I/O circuit having a breakdown voltage of 8V and a power supply voltage of 5V as indicated by "5V-IO" in Investigation Example 2 of FIG. 31 allows write/erase operation of the MONOS transistor.

In the semiconductor device of First Embodiment, on the other hand, the charge storage portion ECP is comprised of two layers of the charge storage film EC1 and EC2 and a single layer of the insulating film IFE placed therebetween. The write/erase voltage of the MONOS transistor is adequate even when the absolute value of it is relatively small, ±10V. In such a case, using an I/O circuit having a breakdown voltage of 5V and a power supply voltage of 3.3V as indicated by "3.3V-IO" in Investigation Example 3 of FIG. 31 allows write/erase operation of the MONOS transistor.

If the write/erase voltage of the MONOS transistor can be reduced more to ±8V, even using an I/O circuit having a breakdown voltage of 4V and a power supply voltage of 2.5V as indicated by "2.5V-IO" in Investigation Example 5 of FIG. 31 allows write/erase operation of the MONOS transistor. By improving the circuit design, even when the write/erase voltage of the MONOS transistor is ±10V, using an I/O circuit having a breakdown voltage of 4V and a power supply voltage of 2.5V as indicated by "2.5V-IO" in Investigation Example 4 of FIG. 31 allows erase/write operation of the MONOS transistor.

With a reduction in the power supply voltage of the I/O circuit to 13V, 5V, 3.3V, or 2.5V, an area of the main circuit including the I/O circuit decreases. In the semiconductor device of First Embodiment, therefore, compared with Comparative Example 1 in which the power supply voltage of the I/O circuit is 13V or 5V, the power supply voltage of the I/O circuit can be reduced to 3.3V or 2.5V and an area of the main circuit including the I/O circuit can be reduced. Due to a decrease in the area of the main circuit, an area of the semiconductor chip as a semiconductor device can be used efficiently. For example, a circuit having another function can be loaded as an add-on circuit.

Main Characteristics and Advantages of Present Embodiment

In the method of manufacturing a semiconductor device according to First Embodiment, the insulating film portion IFP comprised of the insulating film IF1, the charge storage film EC1 on the insulating film IF1, the insulating film IFE on the charge storage film EC1, the charge storage film EC2 on the insulating film IFE, and the insulating film IF2 on the charge storage film EC2 is formed on the semiconductor substrate SB. Then, the conductive film CF1 is formed on the insulating film portion IFP, followed by patterning of the conductive film CF1 and the insulating film portion IFP to form the gate electrode CG and the gate insulating film GIM. The charge storage film EC1 contains silicon and nitrogen; the insulating film IFE contains silicon and oxygen; and the charge storage film EC2 contains silicon and nitrogen. The thickness THIE of the insulating film IFE is smaller than the thickness THE1 of the charge storage film EC1 and the thickness THE2 of the charge storage film EC2 is greater than the thickness THE1 of the charge storage film EC1. The insulating film IFE is formed by treating the upper surface of the charge storage film EC1 with a water-containing treatment liquid.

As a result, the insulating film IFE containing silicon and oxygen can be formed, with good film-thickness controllability in a short time, on the side closer to the semiconductor substrate SB with respect to the center position in the thickness direction of the charge storage portion ECP. This makes it possible to provide a semiconductor device equipped with a memory cell comprised of a MONOS transistor, which device needs a write/erase voltage of a smaller absolute value, has improved data retention properties, and can be manufactured at improved throughput.

Second Embodiment

In the method of manufacturing a semiconductor device according to First Embodiment, the insulating film IFE is formed on the charge storage film EC1 by treating the semiconductor substrate SB with pure water used as a treatment liquid. In the method of manufacturing a semiconductor device according to Second Embodiment, on the other hand, the insulating film IFE is formed on the charge storage film EC1 by treating the semiconductor substrate SB with various water-containing treatment liquids such as an ozone water-containing or a hydrogen peroxide water-containing treatment liquid.

The structure of the semiconductor device of Second Embodiment is similar to that of the semiconductor device of First Embodiment.

<Manufacturing Steps of Semiconductor Device>

Figure 32:
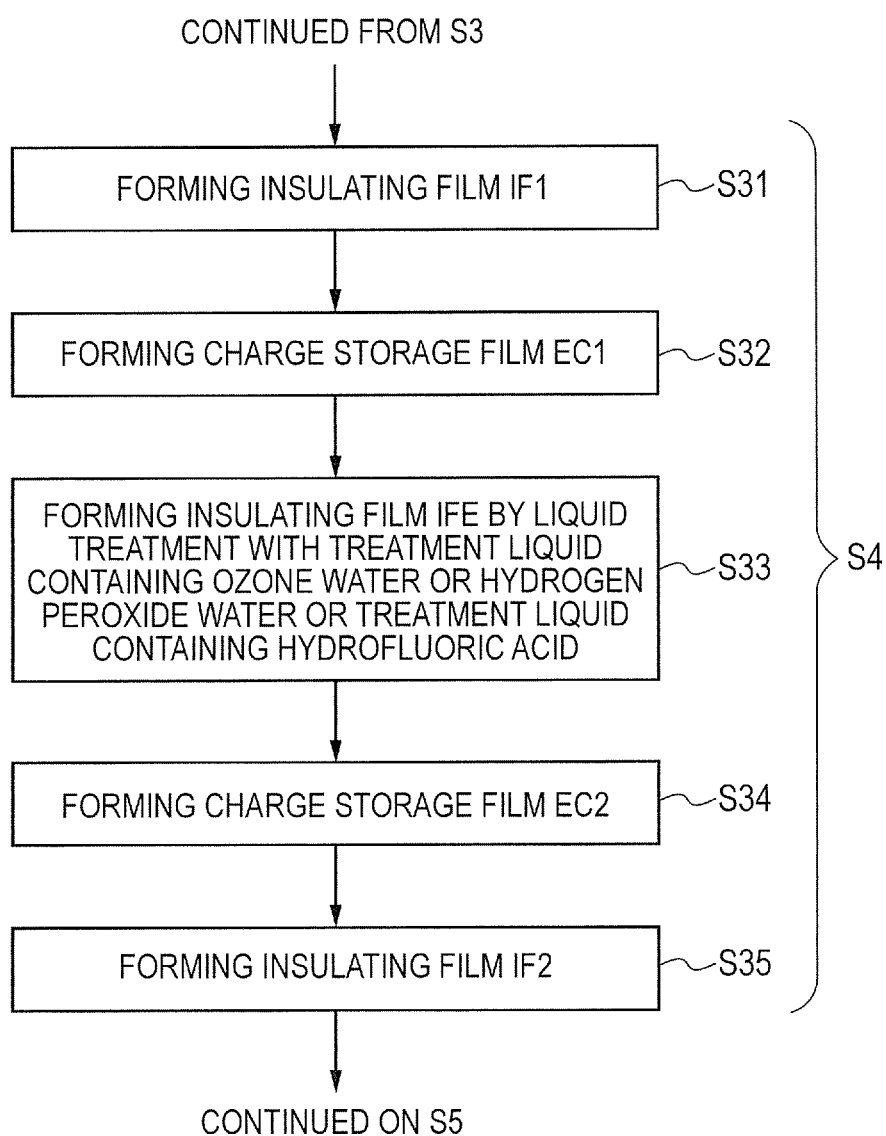
FIG. 32 is a process flow chart showing some of manufacturing steps of a semiconductor device of Second Embodiment.

FIG. 32 is a process flow chart showing some manufacturing steps of the semiconductor device of Second Embodiment. FIG. 32 shows steps included in Step S4 of FIG. 6.

In the method of manufacturing a semiconductor device according to Second Embodiment, similar to the method of manufacturing a semiconductor device according to First Embodiment, after Step S1 to Step S3 in FIG. 6, steps similar to Step S21 and Step S22 in FIG. 7 (Step S31 and Step S32 in FIG. 32) are performed. By these steps, the insulating film IF1 and the charge storage film EC1 of the insulating film portion IFP are formed as shown in FIGS. 10 to 13.

Next, as shown in FIGS. 12 and 13, liquid treatment, that is, wet treatment with a water-containing treatment liquid is performed to form an insulating film IFE (Step S33 in FIG. 32). In this Step S33, similar to Step S23 in FIG. 7, the insulating film IFE is formed on the charge storage film EC1 in the memory formation region MR. The insulating film IFE is an insulating film containing silicon and oxygen and is comprised of, for example, silicon oxide or silicon oxynitride.

In this Step S33, similar to Step S23 in FIG. 7, the semiconductor substrate SB subjected to Step S32 is supported by a wafer stage (not shown) provided in a liquid treatment apparatus (not shown). Next, the wafer stage and the semiconductor substrate SB are rotated together and a treatment liquid maintained, for example, at room temperature, that is, 23° C. is supplied to the upper surface PS of the semiconductor substrate SB, for example, for about 30 seconds from a nozzle (not shown) provided in the liquid treatment apparatus. With the treatment liquid thus supplied, the upper surface of the charge storage film EC1 made of, for example, silicon nitride is liquid-treated, that is, wet-treated to form the insulating film IFE having a thickness THIE on the charge storage film EC1.

In Second Embodiment, on the other hand, various water-containing treatment liquids such treatment liquid containing ozone ($O_3$) water or hydrogen peroxide ($H_2O_2$) water and a treatment liquid containing hydrofluoric acid can be used. Of these, a treatment liquid containing ozone ($O_3$) water or hydrogen peroxide ($H_2O_2$) water is a treatment liquid for forming an oxide film, while a hydrofluoric acid-containing treatment liquid is a treatment liquid for removing the oxide film.

When ozone water is used as the treatment liquid, the treatment liquid maintained, for example, at room temperature, that is, 23° C. can be supplied to the upper surface PS of the semiconductor substrate SB, for example, for about 10 seconds. The concentration of ozone water can be set at from 1 to 100 mg/L.

As the treatment liquid containing hydrogen peroxide water, sulfuric acid-hydrogen peroxide mixture (SPM), ammonium hydroxide-hydrogen peroxide mixture (APM) or hydrochloride-hydrogen peroxide mixture (HPM) can be used. When the hydrogen peroxide water-containing treatment liquid is used, this treatment liquid maintained at, for example, from about 23 to 160° C. can be supplied to the upper surface PS of the semiconductor substrate SB, for example, for about 10 seconds.

Compared with pure water used as the treatment liquid in Step S23, the treatment liquid containing ozone water or hydrogen peroxide water used as the treatment liquid in Step S33 has stronger oxidation power. This means that in the method of forming the insulating film IFE in Step S33 compared with the method of forming the insulating film IFE in Step S23, the insulating film IFE as an oxide film is formed more positively on the upper surface of the charge storage film EC1. Using the ozone water-containing or hydrogen peroxide water-containing treatment liquid can, for example, shorten the supply time of the treatment liquid.

As a first modification example of Step S33, a step of treating the upper surface of the charge storage film EC1 with a certain kind of a treatment liquid selected from ozone water-containing and hydrogen peroxide-containing treatment liquids and a step of treating the upper surface of the charge storage film EC1 with the other kind of a treatment liquid or pure water can be used in combination.

As a second modification example of Step S33, a step (first step) of liquid-treating the upper surface of the charge storage film EC1 with any of treatment liquids containing pure water, ozone water, and hydrogen peroxide water and a step (second step) of liquid-treating the upper surface of the charge storage film EC1 with a hydrofluoric acid-containing treatment liquid may be used in combination. As the hydrofluoric acid-containing treatment liquid, for example, buffered hydrofluoric acid (BHF) may be used.

An ultra-thin oxide film formed on the upper surface of the charge storage film EC1 can be removed in the first step by liquid-treating the upper surface of the charge storage film EC1 with a hydrofluoric acid-containing treatment liquid in the second step. The insulating film IFE can be formed on the charge storage film EC1 while improving a junction between the charge storage film EC1 and the insulating film IFE, for example, carrying out the second step to clean the upper surface of the charge storage film EC1 and then forming an oxide film by the first step.

The insulating film IFE can also be formed on the charge storage film EC1, for example, by repeating the first step and the second step alternately. Since the insulating film IFE is formed while etching the surface layer of the upper surface on the charge storage film EC1, the insulating film IFE can be formed on the charge storage film EC1 while improving a junction between the charge storage film EC1 and the insulating film IFE further.

In Step S33 similar to Step S23, the thickness of the insulating film IFE is equal to or greater than at least a single atomic layer or greater than 0.1 nm. The thickness THIE of the insulating film IFE is smaller than the thickness THE1 of the charge storage film EC1. Further, the thickness THIE of the insulating film IFE is smaller than the thickness TH1 of the insulating film IF1.

This means that in Step S33 similar to Step S23, the ultra-thin insulating film IFE can be formed by the above-mentioned liquid treatment with good film-thickness controllability in a short time After supply of pure water is stopped, drying treatment is performed by rotating the semiconductor substrate SB and shaking off the liquid from it, for example, for about 20 seconds. Then, the rotation of the semiconductor substrate SB is stopped and the semiconductor substrate SB is removed from the wafer stage.

The upper surface of the charge storage film EC1 can be made smooth by liquid-treating the semiconductor substrate SB with the treatment liquid to remove foreign matters attached to the upper surface of the charge storage film EC1. The MONOS transistor thus obtained can therefore have improved reliability.

Next, steps (Step S34 and Step S35 in FIG. 32) similar to Step S24 and Step S25 in FIG. 7 are performed to form an insulating film portion IFP including the insulating film IF1, the charge storage film EC1, the insulating film IFE, a charge storage film EC2, and an insulating film IF2.

Steps S5 to S11 in FIG. 6 are then performed to form a semiconductor device similar to the semiconductor device of First Embodiment shown in FIG. 3.

Main Characteristics and Advantages of Present Embodiment

In the method of manufacturing a semiconductor device according to Second Embodiment similar to the method of manufacturing a semiconductor device according to First Embodiment, the insulating film IFE is formed by treating the upper surface of the charge storage film EC1 with a water-containing treatment liquid. Second Embodiment therefore has advantages similar to those of First Embodiment.

In Second Embodiment, on the other hand, an ozone water-containing or hydrogen peroxide water-containing treatment liquid can be used as the treatment liquid. Either the ozone water-containing or hydrogen peroxide water-containing treatment liquid has stronger oxidation power than that of pure water used as the treatment liquid in First Embodiment. A supply time of the treatment liquid can therefore be shortened in Second Embodiment compared with First Embodiment. Further, the semiconductor device provided in Second Embodiment, compared with that provided in First Embodiment, can have improved data retention properties and therefore have improved performance.

In Second Embodiment, a hydrofluoric acid-containing treatment liquid may be used as the treatment liquid. A junction between the charge storage film EC1 and the insulating film IFE can be improved by using, in combination, a step of carrying out liquid treatment for forming an oxide film and a step of supplying a hydrofluoric acid-containing treatment liquid for removing the oxide film and thereby carrying out liquid treatment.

Third Embodiment

In the method of manufacturing a semiconductor device according to First Embodiment, the insulating film IFE is formed on the charge storage film EC1 by liquid-treating the semiconductor substrate SB with a treatment liquid. In the method of manufacturing a semiconductor device according to Third Embodiment, on the other hand, an insulating film IFE is formed using a film forming apparatus.

The structure of the semiconductor device of Third Embodiment is similar to that of the semiconductor device of First Embodiment.

<Manufacturing Steps of Semiconductor Device>

Figure 33:
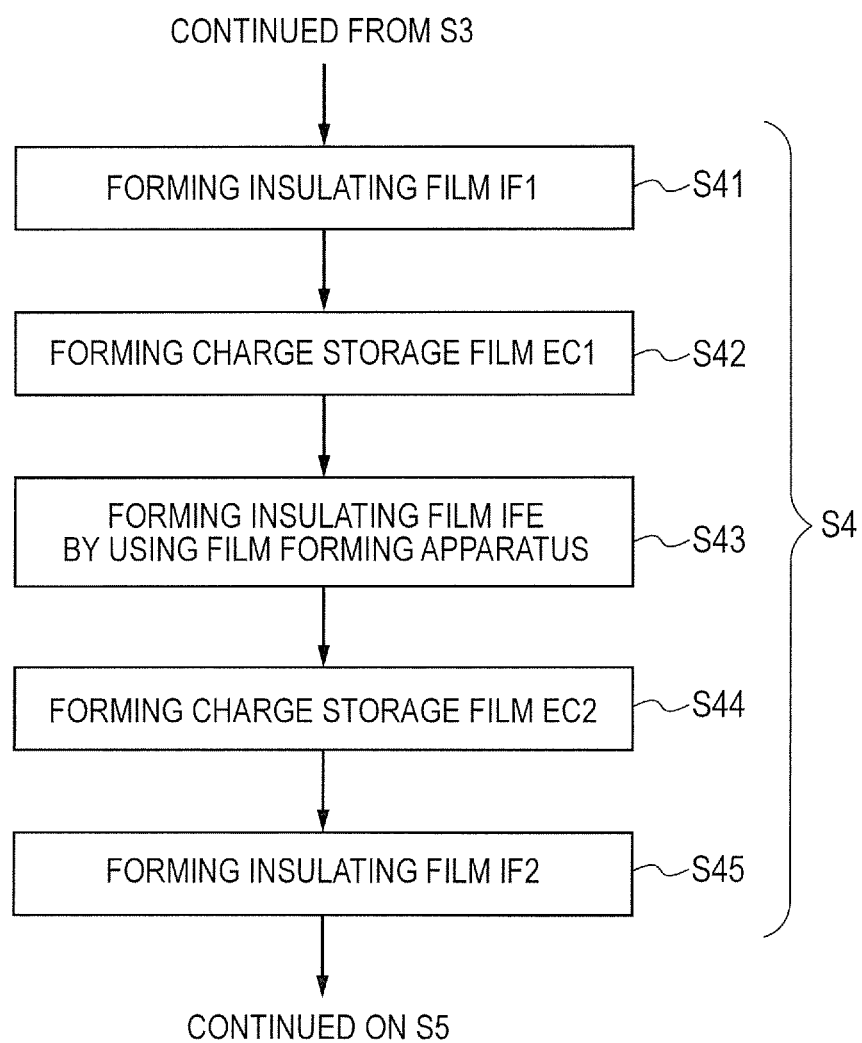
FIG. 33 is a process flow chart showing some of manufacturing steps of a semiconductor device of Third Embodiment.

FIG. 33 is a process flow chart showing some manufacturing steps of the semiconductor device of Third Embodiment. FIG. 33 shows steps included in Step S4 in FIG. 6.

In the method of manufacturing a semiconductor device according to Third Embodiment similar to the method of manufacturing a semiconductor device according to First Embodiment, after Step S1 to Step S3 shown in FIG. 6 are performed, steps (Step S41 and Step S42 in FIG. 33) similar to Step S21 and Step 22 in FIG. 7 are performed. By these steps, as shown in FIGS. 10 to 13, an insulating film IF1 and a charge storage film EC1, which configure an insulating film portion IFP, are formed.

Next, as shown in FIGS. 12 and 13, the insulating film IFE is formed (Step S43 in FIG. 33). In Step S43, different from Step S23 in FIG. 7, the insulating film IFE is formed on the upper surface PS of the semiconductor substrate SB in the memory formation region MR by using a film forming apparatus. The insulating film IFE is an insulating film containing silicon and oxygen and is comprised of, for example, silicon oxide or silicon oxynitride.

The insulating film IFE is preferably formed by ALD. In ALD, a step of causing chemical adsorption of molecules of a precursor gas to form one atomic layer and a step of purging the excess molecules of the precursor gas to remove them are repeated alternately to stack the resulting atomic layers one by one to form a film. In LPCVD, a temperature of 600° C. or more is usually necessary for forming the insulating film IFE which is homogeneous and made of, for example, silicon nitride, but in ALD, the insulating film IFE which is homogeneous can be formed even at a temperature less than 600° C., for example, a temperature as low as about 400° C. or less.

When in Step S42 similar to Step S22 in FIG. 7, the charge storage film EC1 is formed by ALD at a temperature as low as less than 600° C., for example, about 400° C. inside a film forming chamber provided inside a film forming apparatus, the insulating film IFE can be formed continuously inside the film forming chamber in Step S43. This leads to improvement in throughput, more specifically, improvement in the number of semiconductor substrates which can be treated per hour in the manufacturing step of the semiconductor device and also leads to shortening in TAT (turn around time), that is, a time necessary from receipt of order to product supply.

In Step S43 similar to Step S23, the thickness of the insulating film IFE is either one atomic layer or more or 0.1 nm or greater. The thickness THIE of the insulating film IFE is smaller than the thickness THE1 of the charge storage film EC1.

In Step S43 similar to Step S23, an ultra-thin insulating film IFE can be formed with good film-thickness controllability in a short time.

The insulating film IFE made of, for example, silicon nitride can be formed, for example, by PECVD instead of ALD at a temperature less than 600° C., which is a film forming temperature employed in LPCVD, thermal CVD, or the like, for example, as low as about 400° C. As described above with regard to the charge storage film EC1, an insulating film containing silicon and oxygen and formed using a film forming apparatus that forms an insulating film IFE at a temperature as low as less than 600° C., that is, a reduced-temperature film forming apparatus will hereinafter be called "reduced temperature oxide film". In Step S43, the charge storage film EC1 as a reduced-temperature oxide film is formed at a temperature less than 600° C., for example, at a temperature as low as about 400° C. by using a reduced-temperature film forming apparatus.

Next, by steps (Step S44 and Step S45 in FIG. 33) similar to Step S24 and Step S25 in FIG. 7, an insulating film portion IFP including the insulating film IF1, the charge storage film EC1, the insulating film IFE, a charge storage film EC2, and an insulating film IF2 can be formed.

Next, by carrying out Step S5 to Step S11 in FIG. 6, a semiconductor device similar to that of First Embodiment shown in FIG. 3 can be formed.

Main Characteristics and Advantages of Present Embodiment

In the method of manufacturing a semiconductor device according to Third Embodiment, the insulating film IFP comprised of the insulating film IF1, the charge storage film EC1 on the insulating film IF1, the insulating film IFE on the charge storage film EC1, the charge storage film EC2 on the insulating film IFE, and the insulating film IF2 on the charge storage film EC2 is formed on the semiconductor substrate SB. Then, the conductive film CF1 is formed on the insulating film portion IFP. The conductive film CF1 and the insulating film portion IFP are patterned to form the gate electrode CG and the gate insulating film GIM. The charge storage film EC1 contains silicon and nitrogen, the insulating film IFE contains silicon and oxygen, and the charge storage film EC2 contains silicon and nitrogen. The thickness THIE of the insulating film IFE is smaller than the thickness THE1 of the charge storage film EC1 and the thickness THE2 of the charge storage film EC2 is greater than the thickness THE1 of the charge storage film EC1. The insulating film IFE is formed by CVD at a temperature less than 600° C.

Also in Third Embodiment similar to First Embodiment, the insulating film IFE containing silicon and oxygen can be formed, in a short time with good film-thickness controllability, in the charge storage portion ECP on the side closer to the semiconductor substrate SB with respect to a center position in the thickness direction of the charge storage portion. Also in Third Embodiment similar to First Embodiment, this makes it possible to provide a semiconductor device equipped with a memory cell comprised of a MONOS transistor, which device needs a write/erase voltage of a smaller absolute value, has improved data retention properties, and can be manufactured at improved throughput.

In Third Embodiment, the charge storage film EC1 is formed in the film forming chamber provided inside the film forming apparatus and then, the insulating film IFE can be formed continuously in the film forming chamber. This leads to further improvement in the throughput in the manufacturing steps of the semiconductor device compared with First Embodiment.

The invention made by the present inventors has been described specifically based on embodiments. It is needless to say that the invention is not limited to or by these embodiments, but can be changed in various ways without departing from the gist of the invention.

What is claimed is:

1. A method of manufacturing a semiconductor device, comprising the steps of:
   (a) providing a semiconductor substrate;
   (b) forming an insulating film portion over the main surface of the semiconductor substrate;
   (c) forming a conductive film over the insulating film portion; and
   (d) patterning the conductive film and the insulating film portion, thereby forming a gate electrode, and a gate insulating film between the gate electrode and the semiconductor substrate,
   wherein the step (b) comprises the steps of:
   (b1) forming a first insulating film containing silicon and oxygen over the main surface of the semiconductor substrate;
   (b2) forming a second insulating film containing silicon and nitrogen over the first insulating film;
   (b3) forming a third insulating film containing silicon and oxygen over the second insulating film;
   (b4) forming a fourth insulating film containing silicon and nitrogen over the third insulating film;
   (b5) forming a fifth insulating film containing silicon and oxygen over the fourth insulating film, and thereby forming the insulating film portion comprised of the first insulating film, the second insulating film, the third insulating film, the fourth insulting film, and the fifth insulating film,
   wherein a thickness of the third insulating film is smaller than a thickness of the second insulating film and a thickness of the fourth insulating film is greater than a thickness of the second insulating film,
   wherein in the step (b2) the second insulating film is a silicon nitride film;
   wherein in the step (b3), an upper surface of the second insulating film is directly treated with a first treatment liquid to form the third insulating film, and wherein the first treatment liquid consists of pure water having a specific resistance at room temperature of at least 10 MΩcm.

2. The method of manufacturing a semiconductor device according to claim 1,
wherein in the step (b2), the second insulating film is formed by atomic layer deposition.

3. The method of manufacturing a semiconductor device according to claim 1,
wherein the gate electrode and the gate insulating film are parts of a nonvolatile memory configured such that
data are written in the nonvolatile memory by injecting electrons from the semiconductor substrate to the gate insulating film, and
data are erased from the nonvolatile memory by injecting holes from the semiconductor substrate to the gate insulating film.

4. The method of manufacturing a semiconductor device according to claim 1,
wherein the step (b3) comprises the steps of:
(b6) treating an upper surface of the second insulating film with the first treatment liquid; and
(b7) treating the upper surface of the second insulating film with a second treatment liquid containing hydrofluoric acid,
wherein in the step (b3), the step (b6) and the step (b7) are repeated alternately to form the third insulating film.

5. The method of manufacturing a semiconductor device according to claim 1,
wherein the first insulating film comprises silicon oxide, the third insulating film comprises silicon oxide, the fourth insulating film comprises silicon nitride, and the fifth insulating film comprises silicon oxide.

6. The method of manufacturing a semiconductor device according to claim 1,
wherein the second insulating film is a first charge storage film, and
wherein the fourth insulating film is a second charge storage film.

7. The method of manufacturing a semiconductor integrated circuit device according to claim 2,
wherein in the step (b2), the atomic layer deposition is conducted at a temperature less than 600° C.

8. The method of claim 1, wherein the pure water has a specific resistance of at least 18 MΩcm.

\* \* \* \* \*